(12) United States Patent
Zhang et al.

(10) Patent No.: US 12,048,153 B2
(45) Date of Patent: Jul. 23, 2024

(54) VERTICAL MEMORY DEVICES

(71) Applicant: Yangtze Memory Technologies Co., Ltd., Hubei (CN)

(72) Inventors: Qiangwei Zhang, Wuhan (CN); Jingjing Geng, Wuhan (CN); Bin Yuan, Wuhan (CN); Xiangning Wang, Wuhan (CN); Chen Zuo, Wuhan (CN); Zhu Yang, Wuhan (CN); Liming Cheng, Wuhan (CN); Zhen Guo, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 595 days.

(21) Appl. No.: 17/213,448

(22) Filed: Mar. 26, 2021

(65) Prior Publication Data

US 2022/0231043 A1 Jul. 21, 2022

Related U.S. Application Data

(63) Continuation of application No. PCT/CN2021/072100, filed on Jan. 15, 2021.

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
CPC ................................ H10B 43/50; H10B 43/35
See application file for complete search history.

(56) References Cited

U.S. PATENT DOCUMENTS

| 9,905,514 B2 | 2/2018 | Tanzawa |
| 10,748,894 B2 | 8/2020 | Chowdhury et al. |
| 10,748,918 B2 | 8/2020 | Tanzawa |

(Continued)

FOREIGN PATENT DOCUMENTS

| CN | 110088906 A | 8/2019 |
| CN | 110931457 A | 3/2020 |

(Continued)

OTHER PUBLICATIONS

International Search Report issued Sep. 28, 2021 in PCT/CN2021/072100, 5 pages.

*Primary Examiner* — Alia Sabur
(74) *Attorney, Agent, or Firm* — Oblon, McClelland, Maier & Neustadt, L.L.P.

(57) ABSTRACT

Aspects of the disclosure provide semiconductor devices. For example, a semiconductor device includes a substrate having a first region and a second region along a first direction that is parallel to a main surface of the substrate. Then, the semiconductor device includes a memory stack that includes a first stack of alternating gate layers and insulating layers and a second stack of alternating gate layers and insulating layers along a second direction that is perpendicular to the main surface of the substrate. Further, the semiconductor device includes a joint insulating layer in the second region and a third stack of alternating gate layers and insulating layers in the first region between the first stack of alternating gate layers and insulating layers and the second stack of alternating gate layers and insulating layers.

10 Claims, 17 Drawing Sheets

(56) References Cited

U.S. PATENT DOCUMENTS

| | | | |
|---|---|---|---|
| 10,892,277 B2 | 1/2021 | Xiao | |
| 2013/0017629 A1* | 1/2013 | Pyo | H10B 41/20 |
| | | | 438/692 |
| 2017/0294383 A1 | 10/2017 | Tanzawa | |
| 2018/0090512 A1* | 3/2018 | Kim | H10B 43/40 |
| 2018/0145029 A1 | 5/2018 | Tanzawa | |
| 2020/0091185 A1* | 3/2020 | Baek | H10B 43/30 |
| 2020/0194457 A1* | 6/2020 | Lee | H10B 43/50 |
| 2020/0235090 A1 | 7/2020 | Chowdhury et al. | |
| 2020/0251490 A1* | 8/2020 | Matsumoto | H01L 23/5226 |
| 2020/0303399 A1 | 9/2020 | Xiao | |
| 2020/0357813 A1 | 11/2020 | Tanzawa | |
| 2020/0395378 A1 | 12/2020 | Son et al. | |

FOREIGN PATENT DOCUMENTS

| | | |
|---|---|---|
| CN | 111244095 A | 6/2020 |
| CN | 112086464 A | 12/2020 |
| TW | 202011573 A | 3/2020 |
| TW | 202029480 A | 8/2020 |
| TW | 202030873 A | 8/2020 |
| TW | 202101770 A | 1/2021 |

\* cited by examiner

VERTICAL MEMORY DEVICES

RELATED APPLICATION

This application is a bypass continuation of International Application No. PCT/CN2021/072100, filed on Jan. 15, 2021. The entire disclosure of the prior application is hereby incorporated by reference in its entirety.

TECHNICAL FIELD

The present application describes embodiments generally related to semiconductor memory devices and fabrication process to form the semiconductor memory devices.

BACKGROUND

Semiconductor manufactures developed vertical device technologies, such as three dimensional (3D) NAND flash memory technology, and the like to achieve higher data storage density without requiring smaller memory cells. In some examples, a 3D NAND memory device includes an array region and a staircase region. The array region includes a stack of alternating gate layers and insulating layers. The stack of alternating gate layers and insulating layers is used to form memory cells that are stacked vertically into memory cell strings. The staircase region includes the respective gate layers in the stair-step form to facilitate forming contacts to the respective gate layers. The contacts are used to connect driving circuitry to the respective gate layers for controlling the stacked memory cells.

SUMMARY

Aspects of the disclosure provide semiconductor devices. For example, a semiconductor device includes a substrate, having a first region and a second region along a first direction that is parallel to a main surface of the substrate. Then, the semiconductor device includes a memory stack that includes a first stack of alternating gate layers and insulating layers and a second stack of alternating gate layers and insulating layers along a second direction that is perpendicular to the main surface of the substrate. Further, the semiconductor device includes a joint insulating layer in the second region and a third stack of alternating gate layers and insulating layers in the first region between the first stack of alternating gate layers and insulating layers and the second stack of alternating gate layers and insulating layers.

In some embodiments, the joint insulating layer is adjacent to the third stack of alternating gate layers and insulating layers along the first direction. In some examples, the third stack of alternating gate layers and insulating layers has a total thickness about the same as the joint insulating layer.

In some embodiments, the third stack of alternating gate layers and insulating layers extends into the second region, and the joint insulating layer is between the third stack of alternating gate layers and insulating layers and the first stack of alternating gate layers and insulating layers in the second region.

In some examples, a thickness of the joint insulating layer is at least a sum thickness of a gate layer and an insulating layer in the first stack of alternating gate layers and insulating layers and the second stack of alternating gate layers and insulating layers.

According to an aspect of the disclosure, in the first region, respective insulating layers in the first stack of alternating gate layers and insulating layers, and in the second stack of alternating gate layers and insulating layers have a same insulating layer thickness.

In some examples, the second region includes a first portion of a channel structure in the first stack of alternating gate layers and insulating layers, a second portion of the channel structure in the second stack of alternating gate layers and insulating layers, and a joint structure in the joint insulating layer, the joint structure connecting the first portion of the channel structure with the second portion of the channel structure.

Aspects of the disclosure provide methods for semiconductor device fabrication. In some embodiments, a method for semiconductor device fabrication includes forming a substrate having a first region and a second region along a first direction that is parallel to a main surface of the substrate and forming, in the first region and the second region, a memory stack that includes a first stack of alternating gate layers and insulating layers and a second stack of alternating gate layers and insulating layers along a second direction that is perpendicular to the main surface of the substrate. Further, the method includes forming, in the second region, a joint insulating layer between the first stack of alternating gate layers and insulating layers and the second stack of alternating gate layers and insulating layers, and forming, in the first region, a third stack of alternating gate layers and insulating layers between the first stack of alternating gate layers and insulating layers and the second stack of alternating gate layers and insulating layers.

To form, in the second region, the joint insulating layer between the first stack of alternating gate layers and insulating layers and the second stack of alternating gate layers and insulating layers, in some embodiments, the method includes depositing alternatingly sacrificial layers and insulating layers for forming the first stack and the third stack of alternating gate layers and insulating layers in the first region and the second region, removing one or more pairs of sacrificial layer and insulating layer from the second region, and forming the joint insulating layer in the second region.

To form the joint insulating layer in the second region, the method includes depositing insulating material for forming the joint insulating layer in the second region and the first region, and removing the insulating material from the first region.

In some embodiments, a thickness of the insulating material is larger than a thickness of the joint insulating layer. In an example to remove the insulating material from the first region, the method includes polishing the insulating material with a stop on a sacrificial layer in the first region. In another example to remove the insulating material from the first region, the method includes performing an etching process based on lithography to thin the insulating material in the first region, and performing a chemical mechanical polishing (CMP) process that levels the insulating material in the first region and the second region.

In some embodiments, a thickness of the insulating material is about the same as the joint insulating layer. In an example to remove the insulating material from the first region, the method includes depositing a protecting layer on the insulating material in the first region and the second region, and polishing the insulating material with a stop on the protecting layer in the second region. In another example to remove the insulating material from the first region, the method includes forming an etch protecting mask that protects the insulating material in the second region, and exposes the insulating material in the first region and etching the insulating material in the first region based on the etch protecting mask.

In some examples, the insulating material includes silicon dioxide, and the protecting layer includes silicon nitride.

In some examples, to deposit alternatingly the sacrificial layers and the insulating layers for forming the first stack and the third stack of alternating gate layers and insulating layers in the first region and the second region, the method includes deposing a last sacrificial layer of the sacrificial layers with a larger thickness than other sacrificial layers in the sacrificial layers.

According to an aspect of the disclosure, the method also includes forming, in the second region, a first portion of a channel structure in the first stack of alternating gate layers and insulating layers, forming, in the second region, a second portion of the channel structure in the second stack of alternating gate layers and insulating layers, and forming, in the second region, a joint structure in the joint insulating layer, the joint structure connecting the first portion of the channel structure with the second portion of the channel structure.

In some embodiments, a method for semiconductor device fabrication can include forming a substrate having a first region and a second region along a first direction that is parallel to a main surface of the substrate, forming, in the first region and the second region, a memory stack that comprises a first stack of alternating gate layers and insulating layers and a second stack of alternating gate layers and insulating layers along a second direction that is perpendicular to the main surface of the substrate. The second stack is stacked directly on the first stack along the second direction in the first region. Then, the method includes forming, in the second region, a joint insulating layer between the first stack of alternating gate layers and insulating layers and the second stack of alternating gate layers and insulating layers.

To form, in the second region, the joint insulating layer between the first stack of alternating gate layers and insulating layers and the second stack of alternating gate layers and insulating layers, in an embodiment, the method includes depositing, in the first region and the second region, a first stack of alternating sacrificial layers and insulating layers for forming the first stack of alternating gate layers and insulating layers, depositing, in the first region and the second region, the joint insulating layer, removing the joint insulating layer from the first region, and depositing, in the first region and the second region, a second stack of alternating sacrificial layers and insulating layers for forming the second stack of alternating gate layers and insulating layers.

Aspects of the disclosure provide another semiconductor device. The semiconductor device includes functional layers and insulating layers stacked in a first region and a second region of the semiconductor device. The first region includes a stack of alternating gate layers and first insulating layers. The first insulating layers in the stack of alternating gate layers and first insulating layers are of a first thickness. The stack of alternating gate layers and first insulating layers includes a first sub stack of alternating gate layers and first insulating layers and a second sub stack of alternating gate layers and first insulating layers. The second region includes the first sub stack of alternating gate layers and first insulating layers, the second sub stack of alternating gate layers and first insulating layers, and a second insulating layer between the first sub stack of alternating gate layers and first insulating layers and the second sub stack of alternating gate layers and first insulating layers. The second insulating layer is of a second thickness that is larger than the first thickness.

In some embodiments, the stack of alternating gate layers and first insulating layers in the first region includes a third sub stack of alternating gate layers and first insulating layers formed in the first region between the first sub stack of alternating gate layers and first insulating layers and the second sub stack of alternating gate layers and first insulating layers.

In an embodiment, a sum thickness of the third sub stack of alternating gate layers and first insulating layers is about the same as the second thickness.

In some embodiments, the second sub stack of alternating gate layers and first insulating layers is stacked adjacent onto the first sub stack of alternating gate layers and first insulating layers in the first region.

In some examples, the second thickness of the second insulating layer is at least a sum thickness of a gate layer and a first insulating layer in the stack of alternating gate layers and first insulating layers.

According to an aspect of the disclosure, the stack of alternating gate layers and first insulating layers is configured to have a staircase form in the first region. In an example, the second insulating layer is excluded from at least a portion of the first region.

In some examples, the semiconductor device includes a first portion of a channel structure in the first sub stack of alternating gate layers and first insulating layers in the second region, a second portion of the channel structure in the second sub stack of alternating gate layers and first insulating layers in the second region, and a joint structure in the second insulating layer, the joint structure connecting the first portion of the channel structure with the second portion of the channel structure.

Aspects of the disclosure provide another method for semiconductor device fabrication. The method includes forming, in a first region of a semiconductor device, a stack of alternating gate layers and first insulating layers. The first insulating layers in the stack of alternating gate layers and first insulating layers are of a first thickness in the first region. The stack of alternating gate layers and first insulating layers includes a first sub stack of alternating gate layers and first insulating layers and a second sub stack of alternating gate layers and first insulating layers. The method includes forming, in a second region of the semiconductor device, a second insulating layer between the first sub stack of alternating gate layers and first insulating layers and the second sub stack of alternating gate layers and first insulating layers. The second insulating layer is of a second thickness that is larger than the first thickness.

In some embodiments, the method includes forming a third sub stack of alternating gate layers and first insulating layers in the first region between the first sub stack of alternating gate layers and first insulating layers and the second sub stack of alternating gate layers and first insulating layers.

In some embodiments, to form, in the second region of the semiconductor device, the second insulating layer between the first sub stack of alternating gate layers and first insulating layers and the second sub stack of alternating gate layers and the first insulating layers, the method includes depositing alternatingly sacrificial layers and insulating layers for forming the first sub stack and the third sub stack of alternating gate layers and first insulating layers on a substrate of the semiconductor device, removing one or more pairs of sacrificial layer and insulating layer from the second region, and forming the second insulating layer in the second region.

To form the second insulating layer in the second region, in some embodiments, the method includes depositing insulating material for forming the second insulating layer in the first region and the second region, and removing the insulating material from the first region.

In some embodiments, a thickness of the insulating material is larger than the second thickness of the second insulating layer. In an example to remove the insulating material from the first region, the method includes polishing the insulating material with a stop on a sacrificial layer in the first region. In another example, the method includes performing an etching process based on lithography to remove the insulating material from the first region, and performing a chemical mechanical polishing (CMP) process that levels the insulating material in the first region with a top surface of the second region.

In some embodiments, a thickness of the insulating material is about the same as the second thickness of the second insulating layer. In an example to remove the insulating material from the first region, the method includes depositing a protecting layer on the insulating material in the first region and the second region, and polishing the insulating material in the first region with a stop on the protecting layer in the second region.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
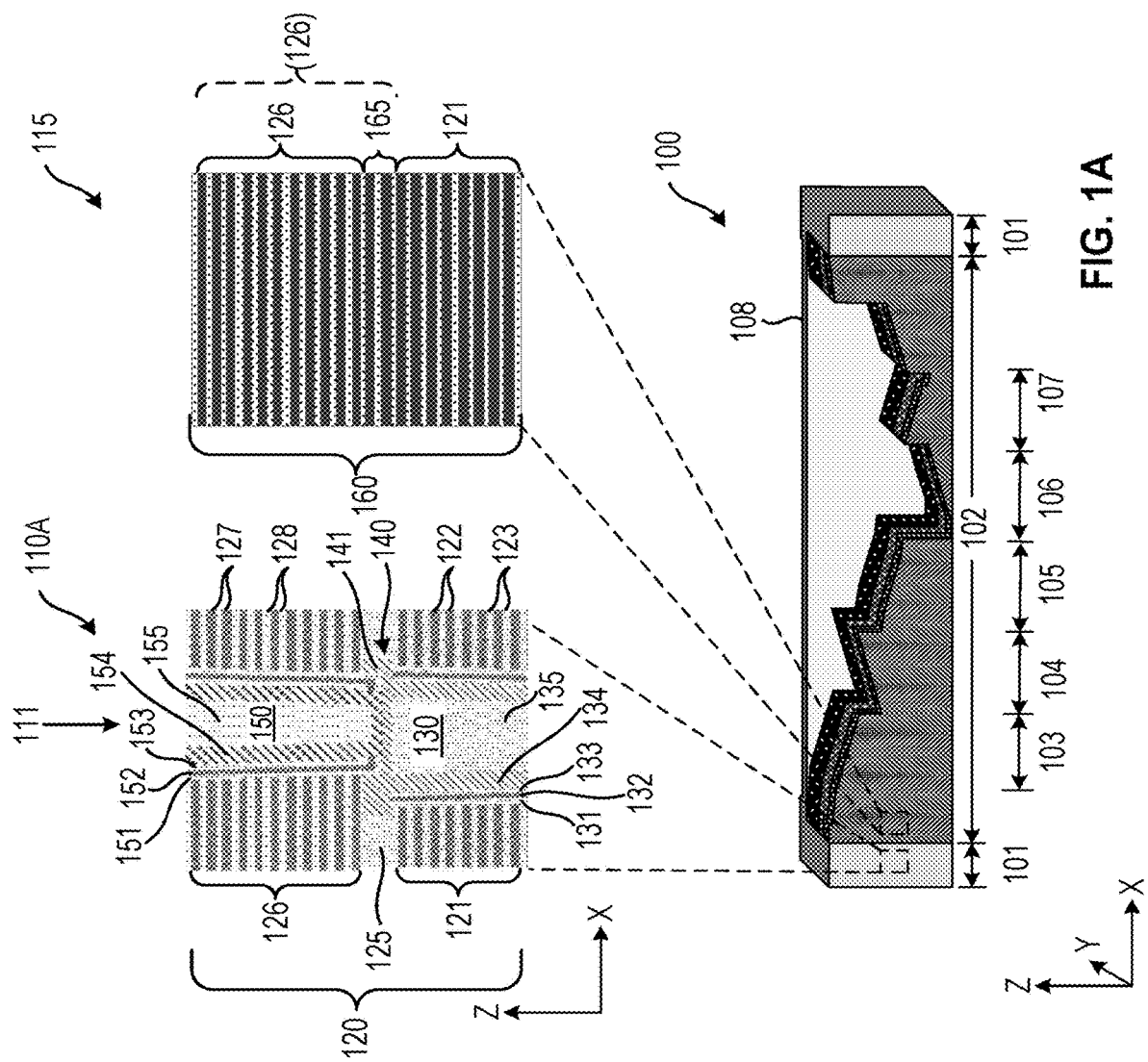
FIGS. 1A-1B show a perspective view of a semiconductor device and enlarged cross-sectional views of portions of the semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, for three-dimensional (3D) memory devices, such as 3D NAND memory devices, increasing the number of memory cells in each memory cell string can increase the storage density. To increase the number of memory cells in the memory cell strings, the number of alternating gate layers and insulating layers is increased. In a gate-last process, the gate layers are formed by replacing sacrificial layers with the gate layers after a formation of channel structures. In a related example, to form the channel structures, channel holes are formed in a stack of alternating sacrificial layers and insulating layers, and channel structures are then formed in the channel holes. When the number of alternating sacrificial layers and insulating layers is increased, it becomes difficult to use a single etching process to form the channel holes in the stack of alternating sacrificial layers and insulating layers that has a substantial depth.

A multi-deck technology is developed to form a channel structure by joining a lower portion of the channel structure with an upper portion of the channel structure. The lower portion of the channel structure is formed in a lower portion channel hole, and the upper portion of the channel structure is formed in an upper portion channel hole. The lower portion channel hole and the upper portion channel hole can be formed using separate etching processes.

In a semiconductor device formed using the multi-deck technology, a channel structure includes a lower portion in a lower stack of gate layers and insulating layers, an upper portion in an upper stack of gate layers and insulating layers, and a joint structure to connect a lower channel layer in the lower portion of the channel structure with an upper channel layer in the upper portion of the channel structure. In some examples, the joint structure is formed in an insulating layer, and the insulating layer is referred to as a joint insulating layer in the present disclosure. The joint insulating layer is disposed between the lower stack and the upper stack of gate layers and insulating layers.

According to some aspects of the disclosure, in the staircase region, stair steps are formed by suitable etching processes that pattern the alternating sacrificial layers and the insulating layers. Generally, the joint insulating layer has a thickness much larger than the thickness of an insulating layer in the alternating sacrificial layers and the insulating layers. During the formation of the staircase, an etch process may need to etch, at different stair steps, the insulating layers or the joint insulating layer. The significant thickness difference between the joint insulating layer and the insulating layers may cause various negative effects, such as etch loading effect and the like. In an example, a deep etch process (also referred to as chop process) is used to form the stair steps in the staircase region. The deep etch process can etch multiple pairs of sacrificial layer and insulating layer from different stair steps and improve process efficiency. However, the existence of the joint insulating layer at a stair step can cause the deep etch process to fail etching the multiple pairs of sacrificial layer and insulating layer at the stair step. Thus, in some examples, the deep etch process cannot be applied when the joint insulating layer exists in the staircase region. In another example, a contact technique relies on the removal of the insulating layers or the joint insulating layer on different stair steps. The contact technique increases thickness of sacrificial layers at stair portions after the removal of the insulating layers or the joint insulating layer on the stair portions in order to form better contacts. The existence of the joint insulating layer can cause a failure to remove the joint insulating layer on a stair portion, and then impact contact formation.

The present disclosure provides techniques to exclude the joint insulating layer from the staircase region, so that the alternating sacrificial layers (gate layers in the final product) and insulating layers in the staircase region may have consistent thicknesses. That way, in the staircase region, the sacrificial layers (gate layers in the final product) in the alternating sacrificial layers and insulating layers are of a same thickness within process variations, and the insulating layers in the alternating sacrificial layers and insulating layers are of a same thickness within process variations. Without the joint insulating layer in the staircase region, the thickness consistency of sacrificial layers (gate layers in the final product) and insulating layers in the staircase region can be substantially maintained to facilitate staircase formation and contact formation in the staircase region.

FIG. 1A shows a perspective view of a semiconductor device 100 and enlarged cross-sectional views of portions of the semiconductor device 100 according to some embodiments of the disclosure. The semiconductor device 100 includes array regions 101 for forming memory cell arrays and staircase regions 102 for forming contacts to gate layers of the memory cell arrays. In the FIG. 1A example, the semiconductor device 100 is configured based on a central staircase architecture. As shown in FIG. 1A, the semiconductor memory device 100 includes a staircase region 102 (referred to as a first region in some examples) disposed between two array regions 101 (referred to as second regions in some examples), and includes a bridge portion 108 that interconnects corresponding gate layers in the two array regions 101. The staircase region 102 can provide contacts to the gate layers of memory cell arrays in the two array regions 101.

It is noted that the semiconductor device 100 can be a suitable device, for example, memory circuits, a semiconductor die with memory circuits formed on the semiconductor die, a semiconductor wafer with multiple semiconductor dies formed on the semiconductor wafer, a semiconductor chip with a stack of semiconductor dies bonded together, a semiconductor package that includes one or more semiconductor dies or chips assembled on a package substrate, and the like.

It is also noted that, the semiconductor device 100 can include other suitable circuitry (not shown), such as logic circuitry, power circuitry, and the like that is formed on the same substrate, or other suitable substrate, and is suitably coupled with the memory cell arrays.

Generally, the semiconductor device 100 includes a substrate (e.g., wafer substrate), and various layers of different materials, such as functional layers (e.g., gate layers, metal layers, polysilicon layers, routing layers and the like) and insulating layers formed on the substrate. The memory cell arrays are formed by the various layers of materials on the substrate. For simplicity, the main surface of the substrate is referred to as an X-Y plane, and the direction perpendicular to the main surface is referred to as Z direction.

According to some aspects of the disclosure, the semiconductor device 100 is formed based on a multi-deck technology that uses joint structures to interconnect multiple portions of channel structures. FIG. 1A also shows a cross-sectional view (e.g., in Z-X plane) of a portion 110A of the semiconductor device 100 that includes a joint structure 140. The portion 110A of the semiconductor device 100 is located in the array region 101.

As shown by the portion 110A, a channel structure 111 is formed in a stack of gate layers and insulating layers 120. The stack of gate layers and insulating layers 120 includes a lower stack 121 (referred to as a first sub stack or a first stack in some examples) of gate layers and insulating layers, a joint insulating layer 125, and an upper stack 126 (referred to as a second sub stack or a second stack in some examples) of gate layers and insulating layers. The channel structure 111 includes a lower portion 130 formed in the lower stack 121 of gate layers and insulating layers, a joint structure 140 formed in the joint insulating layer 125, and an upper portion 150 formed in the upper stack 126 of gate layers and insulating layers.

In some embodiments, the lower stack 121 of gate layers and insulating layers includes gate layers 122 and insulating layers 123 that are stacked alternatingly. The gate layers 122 and the insulating layers 123 are configured to form first transistors that are stacked vertically. In some examples, the first transistors formed in the lower stack 121 includes memory cells and one or more bottom select transistors. In some examples, the first transistors can include one or more dummy select transistors. The gate layers 122 correspond to gates of the transistors. The gate layers 122 are made of gate stack materials, such as high dielectric constant (high-k) gate insulator layers, metal gate (MG) electrode, and the like. The insulating layers 123 are made of insulating material(s), such as silicon nitride, silicon dioxide, and the like. In some examples, the gate layers 122 are of a same thickness within process variations, such as about 300 Å, and the insulating layers 123 are of a same thickness within process variations, such as about 200 Å. Thus, a pair of gate layer and insulating layer has a thickness of about 500 Å.

Further, the lower portion 130 of the channel structure 111 is formed in the lower stack 121 of gate layers and insulating layers and extends vertically (Z direction) into the lower stack 121. In some embodiments, the lower portion 130 has a pillar shape that extends in the Z direction that is perpendicular to the direction of the main surface of the substrate (not shown). In an embodiment, the lower portion 130 of the channel structure 111 is formed by materials in the circular shape in the X-Y plane, and extends in the Z direction. For example, the lower portion 130 of the channel structure 111 includes function layers, such as a blocking insulating layer 131 (e.g., silicon dioxide), a charge storage layer (e.g., silicon nitride) 132, a tunneling insulating layer 133 (e.g., silicon dioxide), a semiconductor layer 134, and an insulating layer 135 that have the circular shape in the X-Y plane, and extend in the Z direction. In an example, an opening for the lower portion 130 of the channel structure 111 can be formed into the lower stack 121 of gate layers and insulating layers, and the opening is referred to as a lower channel hole. The blocking insulating layer 131 (e.g., silicon dioxide) is formed on the sidewall of the lower channel hole, and then the charge storage layer (e.g., silicon nitride) 132, the tunneling insulating layer 133, the semiconductor layer 134, and the insulating layer 135 are sequentially stacked from the sidewall. The semiconductor layer 134 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 135 is formed of an insulating material, such as silicon dioxide and/or silicon nitride, and/or may be formed as an air gap.

Similarly, in some embodiments, the upper stack 126 of gate layers and insulating layers includes gate layers 127 and insulating layers 128 that are stacked alternatingly. The gate layers 127 and the insulating layers 128 are configured to form second transistors that are stacked vertically. In some examples, the second transistors formed in the upper stack 126 includes memory cells and one or more top select transistors. In some examples, the second transistors can include one or more dummy select transistors. The gate layers 127 correspond to gates of the transistors. The gate layers 127 are made of gate stack materials, such as high dielectric constant (high-k) gate insulator layers, metal gate (MG) electrode, and the like. The insulating layers 128 are made of insulating material(s), such as silicon nitride, silicon dioxide, and the like. In some examples, the gate layers 127 are of a same thickness within process variations, such as about 300 Å, and the insulating layers 128 are of a same thickness within process variations, such as about 200 Å. Thus, a pair of gate layer and insulating layer has a thickness of about 500 Å.

Further, the upper portion 150 of the channel structure 111 is formed in the upper stack 126 of gate layers and insulating layers and extends vertically (Z direction) in the upper stack 126. In some embodiments, the upper portion 150 has a pillar shape that extends in the Z direction that is perpendicular to the direction of the main surface of the substrate (not shown). In an embodiment, the upper portion 150 of the channel structure 111 is formed by materials in the circular shape in the X-Y plane, and extends in the Z direction. For example, the upper portion 150 of the channel structure 111 includes function layers, such as a blocking insulating layer 151 (e.g., silicon dioxide), a charge storage layer (e.g., silicon nitride) 152, a tunneling insulating layer 153 (e.g., silicon dioxide), a semiconductor layer 154, and an insulating layer 155 that have the circular shape in the X-Y plane, and extend in the Z direction. In an example, an opening for the upper portion 150 of the channel structure 111 can be formed into the upper stack 126 of gate layers and insulating layers, and the opening is referred to as an upper channel hole. In an example, the blocking insulating layer 151 (e.g., silicon dioxide) is formed on the sidewall of upper channel hole, and then the charge storage layer (e.g., silicon nitride) 152, the tunneling insulating layer 153, the semiconductor layer 154, and the insulating layer 155 are sequentially stacked from the sidewall. The semiconductor layer 154 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 155 is formed of an insulating material, such as silicon dioxide and/or silicon nitride, and/or may be formed as an air gap.

Further, in some embodiments, the joint structure 140 is formed in the joint insulating layer 125. In an embodiment, the joint insulating layer 125 is silicon dioxide. The joint structure 140 is formed in an opening in the joint insulating layer 125, and includes a semiconductor layer 141 that is configured to join the semiconductor layer 134 in the lower portion 130 of the channel structure 111 with the semiconductor layer 154 in the upper portion 150 of the channel structure 111. The semiconductor layer 141 can be any suitable semiconductor material, such as polysilicon or monocrystalline silicon, and the semiconductor material may be un-doped or may include a p-type or n-type dopant. In some embodiments, the thickness of the joint insulating layer 125 is about one or more pairs of gate layer and insulating layer. In an example, a pair of gate layer and insulating layer has a thickness of about 500 Å and the joint insulating layer 125 has a thickness of about 1000 Å.

Figure 1B:
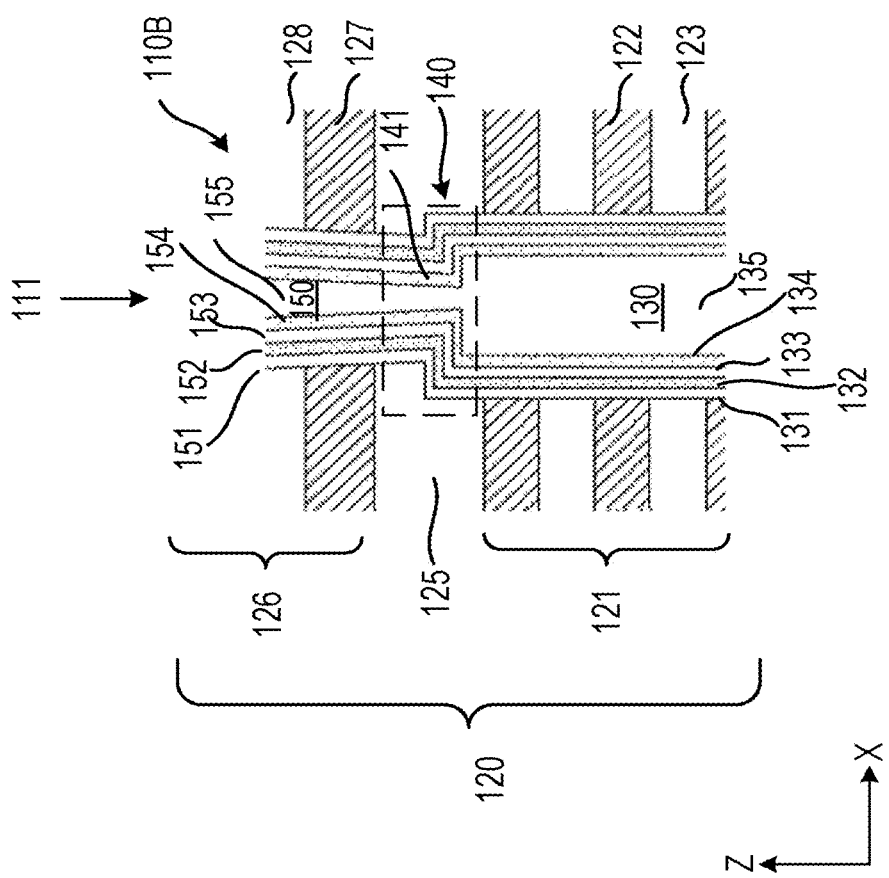

It is noted that the joint structure 140 can have other suitable structure. FIG. 1B shows another cross-sectional view (e.g., in Z-X plane) of a portion 110B that includes a joint structure 140. For ease of illustration, the portion 110B is scaled differently from the portion 110A. The portion 110B can be suitably scaled, and can replace the portion 110A in the semiconductor device 100. Some semiconductor devices can have joint structures shown as the portion 110A and some semiconductor devices can have join structures shown as the portion 110B.

As shown in the portion 110B, a channel structure 111 is formed in a stack of gate layers and insulating layers 120. The stack of gate layers and insulating layers 120 includes a lower stack 121 (also referred to as a first sub stack) of gate layers and insulating layers, a joint insulating layer 125 and an upper stack 126 (also referred to as a second sub stack) of gate layers and insulating layers. The channel structure 111 includes a lower portion 130 formed in the lower stack 121 of gate layers and insulating layers, a joint structure 140 formed in the joint insulating layer 125, and an upper portion 150 formed in the upper stack 126 of gate layers and insulating layers.

In some embodiments, the lower stack 121 of gate layers and insulating layers includes gate layers 122 and insulating layers 123 that are stacked alternatingly. The gate layers 122 and the insulating layers 123 are configured to form first transistors that are stacked vertically. In some examples, the first transistors formed in the lower stack 121 includes memory cells and one or more bottom select transistors. In some examples, the first transistors can include one or more dummy select transistors. The gate layers 122 correspond to gates of the transistors. The gate layers 122 are made of gate stack materials, such as high dielectric constant (high-k) gate insulator layers, metal gate (MG) electrode, and the like. The insulating layers 123 are made of insulating material(s), such as silicon nitride, silicon dioxide, and the like. In some examples, the gate layers 122 are of a same thickness within process variations, such as about 300 Å, and the insulating layers 123 are of a same thickness within process variations, such as about 200 Å. Thus, a pair of gate layer and insulating layer has a thickness of about 500 Å.

Further, the lower portion 130 of the channel structure 111 is formed in the lower stack 121 of gate layers and insulating layers and extends vertically (Z direction) into the lower stack 121. In some embodiments, the lower portion 130 has a pillar shape that extends in the Z direction that is perpendicular to the direction of the main surface of the substrate (not shown). In an embodiment, the lower portion 130 of the channel structure 111 is formed by materials in the circular shape in the X-Y plane, and extends in the Z direction. For example, the lower portion 130 of the channel structure 111 includes function layers, such as a blocking insulating layer 131 (e.g., silicon dioxide), a charge storage layer (e.g., silicon nitride) 132, a tunneling insulating layer 133 (e.g., silicon dioxide), a semiconductor layer 134, and an insulating layer 135 that have the circular shape in the X-Y plane, and extend in the Z direction.

Similarly, in some embodiments, the upper stack 126 of gate layers and insulating layers includes gate layers 127 and insulating layers 128 that are stacked alternatingly. The gate layers 127 and the insulating layers 128 are configured to form second transistors that are stacked vertically. In some examples, the second transistors formed in the upper stack 126 includes memory cells and one or more top select transistors. In some examples, the second transistors can include one or more dummy select transistors. The gate layers 127 correspond to gates of the transistors. The gate layers 127 are made of gate stack materials, such as high dielectric constant (high-k) gate insulator layers, metal gate (MG) electrode, and the like. The insulating layers 128 are made of insulating material(s), such as silicon nitride, silicon dioxide, and the like. In some examples, the gate layers 127 are of a same thickness within process variations, such as about 300 Å, and the insulating layers 128 are of a same thickness within process variations, such as about 200 Å. Thus, a pair of gate layer and insulating layer has a thickness of about 500 Å.

Further, the upper portion 150 of the channel structure 111 is formed in the upper stack 126 of gate layers and insulating layers and extends vertically (Z direction) in the upper stack 126. In some embodiments, the upper portion 150 has a pillar shape that extends in the Z direction that is perpendicular to the direction of the main surface of the substrate (not shown). In an embodiment, the upper portion 150 of the channel structure 111 is formed by materials in the circular shape in the X-Y plane, and extends in the Z direction. For example, the upper portion 150 of the channel structure 111 includes function layers, such as a blocking insulating layer 151 (e.g., silicon dioxide), a charge storage layer (e.g., silicon nitride) 152, a tunneling insulating layer 153 (e.g., silicon dioxide), a semiconductor layer 154, and an insulating layer 155 that have the circular shape in the X-Y plane, and extend in the Z direction.

Further, in some embodiments, the joint structure 140 is formed in the joint insulating layer 125. In an embodiment, the joint insulating layer 125 is silicon dioxide. The joint structure 140 is formed in an opening in the joint insulating layer 125, and includes a semiconductor layer 141 that is configured to join the semiconductor layer 134 in the lower portion 130 of the channel structure 111 with the semiconductor layer 154 in the upper portion 150 of the channel structure 111. The semiconductor layer 141 can be any suitable semiconductor material, such as polysilicon or monocrystalline silicon, and the semiconductor material may be un-doped or may include a p-type or n-type dopant.

In the FIG. 1B example, in some embodiments, the blocking insulating layer 151 and the block insulating layer 131 are formed using same processing steps at the same time; the charge storage layer 152 and the charge storage layer 132 are formed using same processing steps at the same time; the tunneling insulating layer 153 and the tunneling insulating layer are formed using the same processing steps at the same time; the semiconductor layer 154, the semiconductor layer 141 and the semiconductor layer 134 are formed using the same processing steps at the same time; and the insulating layer 155 and the insulating layer 135 are formed using the same processing steps at the same time.

In some examples, the lower channel hole for the portion 130 is initially filled with a sacrificial channel structure, such as sacrificial polysilicon. After an opening (upper channel hole) for the upper portion 150 of the channel structure 111 is formed, the sacrificial channel structure is exposed and removed from the lower channel hole, thus the lower channel hole is combined with the upper channel hole into a channel hole. In an example, the blocking insulating layer 151/131 (e.g., silicon dioxide) is formed on the sidewall of the channel hole, and then the charge storage layer (e.g., silicon nitride) 152/132, the tunneling insulating layer 153/133, the semiconductor layer 154/141/134, and the insulating layer 155/135 are sequentially stacked from the sidewall. The semiconductor layer 154/141/134 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 155 is formed of an insulating material, such as silicon dioxide and/or silicon nitride, and/or may be formed as an air gap.

In some embodiments, the thickness of the joint insulating layer 125 is about one or more pairs of gate layer and insulating layer. In an example, a pair of gate layer and insulating layer has a thickness of about 500 Å and the joint insulating layer 125 has a thickness of about 1000 Å.

According to some aspects of the disclosure, the lower stack 121 of gate layers and insulating layers and the upper stack 126 of gate layers and insulating layers can extend into the staircase region 102. In some embodiments, in the staircase region 102, one or more additional pairs of gate and insulating layer are formed, in the place of the joint insulating layer 125, between the lower stack 121 of gate layers and insulating layers and the upper stack 126 of gate layers and insulating layers. In some embodiments, in the staircase region 102, the upper stack 126 of gate layers and insulating layers is directly stacked on the lower stack 121 of gate layers and insulating layers.

FIG. 1A also shows a cross-sectional view (e.g., in Z-X plane) of a portion 115 of the semiconductor device 100. The portion 115 of the semiconductor device 100 is located in the staircase region 102 and of a same range in the Z direction as the portion 110A. The portion 115 includes a stack 160 of gate layers and insulating layers with a consistent gate layer thickness and a consistent insulating layer thickness. The portion 115 includes the lower stack 121 of gate layers and insulating layers that extends from the array region 101 into the staircase region 102, and includes the upper stack 126 of gate layers and insulating layers that also extends from the array region 101 into the staircase region 102. In some embodiments, the stack 160 of gate layers and insulating layers 160 includes a middle stack 165 (also referred to as a third stack in some examples) of alternating gate layers and insulating layers between the lower stack 121 and the upper stack 126, in the place of the joint insulating layer 125. In an example, the middle stack 165 of alternating gate layers and insulating layers has a total thickness about the same as the join insulating layer 125. In an example, gate layers in the middle stack 165 of alternating gate layers and insulating layers are respectively about the same thickness as the gate layers in the lower stack 121 and the upper stack 126, insulating layers in the middle stack 165 of alternating gate layers and insulating layers are respectively have about the same thickness as the insulating layers in the lower stack 121 and the upper stack 126.

In some embodiments, in the staircase region 102, the stack 160 of gate layers and insulating layers includes the lower stack 121 of gate layers and insulating layers that extends from the array region 101 into the staircase region 102, and includes the upper stack 126 of gate layers and insulating layers that also extends from the array region 101 into the staircase region 102. The upper stack 126 of gate layers and insulating layers (as shown by a dashed bracket) is directly stacked on the lower stack 121 of gate layers and insulating layers.

According to an aspect of the disclosure, the staircase region 102 includes a staircase that is formed using a deep etch process (also referred to as chop process). In some examples, the staircase is formed by etch-trim process and chop process, such as disclosed in Applicant's co-pending application Ser. No. 16/684,844, filed Nov. 15, 2019, which is incorporated herein by reference in its entirety.

For example, the staircase region 102 includes sections, and the stair steps in the sections can be formed at the same time (e.g., in the same trim-etch cycles) of a same stair step pattern, and then deep etch processes are used to remove layers and shift stair steps of the different sections to the appropriate layers. Thus, the total number of trim-etch cycles can be reduced. For example, when two sections are used, the total number of the trim-etch cycles can be reduced by half, and the height difference of the upper stair steps to the lower stair steps in the trim-etch process can be reduced by half for example.

Specifically, in an example, the staircase region 102 includes sections 103-107. In some embodiments, a gate-last process that replaces sacrificial layers with real gate layers at a later time, for example, after a formation of channel structures is used. In the gate-last process, stair steps are first formed in sacrificial layers and insulating layers, and then the sacrificial layers are later replaced by real gate layers. In an example to form stair steps in 150 pairs of sacrificial layers and insulating layers, by the same trim-etch cycles, the same stair step pattern is formed in the sections 103-107 in the top 30 pairs of sacrificial layer and insulating layer. Using deep etch process, the stair step pattern in the section 104 is shifted down, for example by 30 pairs of sacrificial layer and insulating layer, and the stair step pattern in the section 105 is shifted down, for example, by 60 pairs of sacrificial layer and insulating layer; the stair step pattern in the section 107 is shifted down, for example, by 90 pairs of sacrificial layer and insulating layer; and the stair step pattern in the section 106 is shifted down, for example, by 120 pairs of sacrificial layer and insulating layer. Thus, in an example that memory cells in a string is numbered as 1 to 150 from bottom up, the stair steps in the section 103 can be used to form connections to gate layers of the memory cells 121-150; the stair steps in the section 104 can be used to form connections to gate layers of the memory cells 91-120; the stair steps in the section 105 can be used to form connections to gate layers of the memory cells 61-90; the stair steps in the section 107 can be used to form connections to gate layers of the memory cells 31-60; the stair steps in the section 106 can be used to form connections to gate layers of the memory cells 1-30.

It is noted that the above example is for illustration, any suitable number of sections, and any suitable number of pairs of sacrificial layer and insulating layer can be used. Also, the staircase region 102 can include stair steps to form connections to the gate layers of the top select transistors and bottom select transistors.

In some examples to perform a deep etch process, a mask layer is disposed, and a portion of the staircase region 102 is suitably exposed. Then, the deep etch process is performed to remove multiple pairs (e.g., 30 pairs, 60 pairs, and the like) of sacrificial layer and insulating layer in the exposed portion of the staircase region 102.

In some examples, the etching of a pair of an insulating layer and a sacrificial layer is performed by an anisotropic etching, such as a reactive ion etch (RIE) or other dry etch processes. In an embodiment, the insulating layer is silicon dioxide. In this example, the etching of silicon dioxide can include RIE using fluorine based gases such as carbon-fluorine (CF4), hexafluoroethane (C2F6), CHF3, or C3F6 and/or any other suitable gases. In some embodiments, the silicon dioxide layer can be removed by wet chemistry, such as hydrofluoric acid or a mixture of hydrofluoric acid and ethylene glycol. In some embodiments, a timed-etch approach can be used. In some embodiments, the sacrificial layer is silicon nitride. In this example, the etching of silicon nitride can include RIE using O2, N2, CF4, NF3, Cl2, HBr, BCl3, and/or combinations thereof. The methods and etchants to remove a single layer stack should not be limited by the embodiments of the present disclosure.

According to an aspect of the disclosure, when the sacrificial layers and insulating layers are respectively of about the same thickness in the staircase region, loading effect in the deep etch process can be alleviated to improve stair step profile and avoid staircase damage.

Figure 1C:
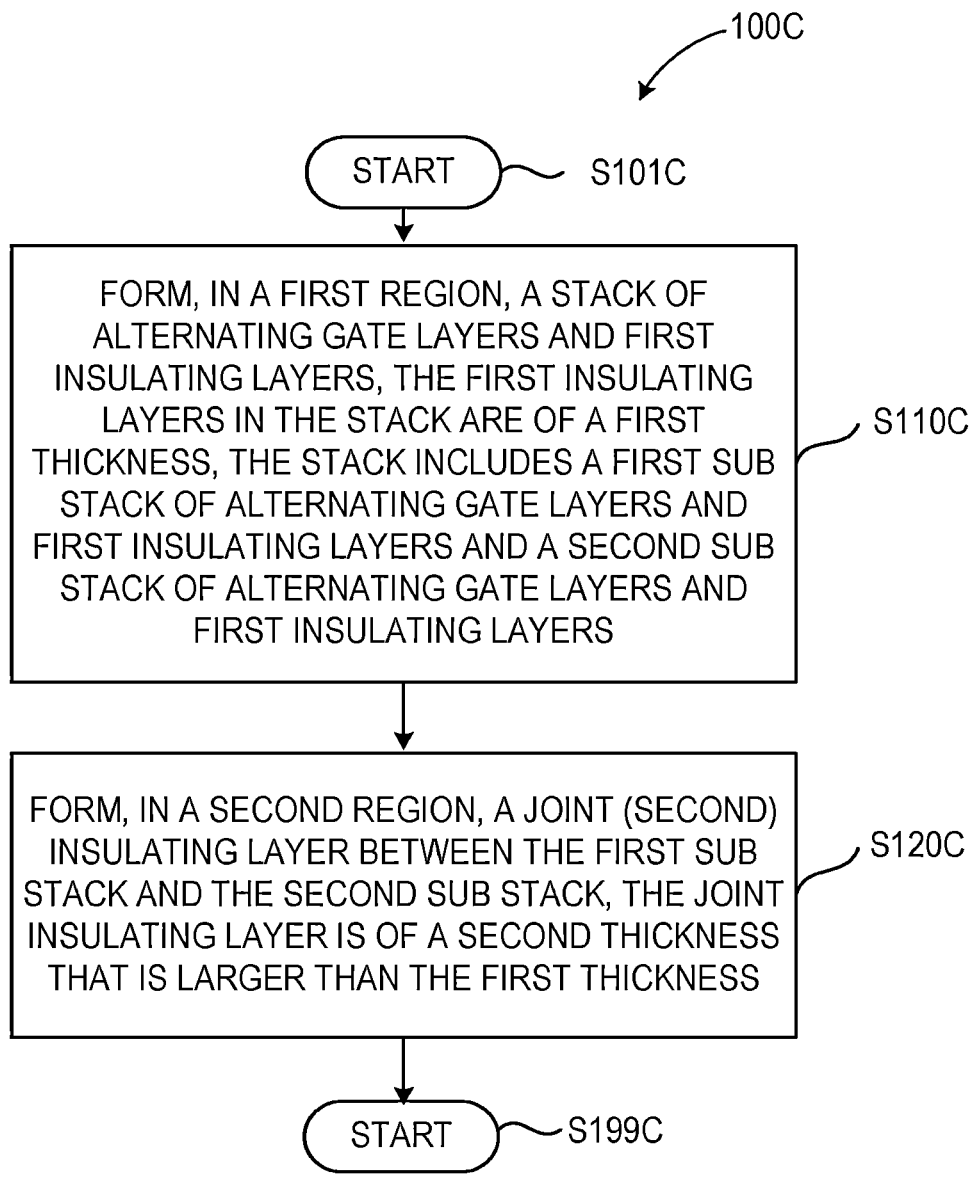
FIG. 1C shows a flow chart outlining a process to form a semiconductor device according to some embodiments of the disclosure.

FIG. 1C shows a flow chart outlining a process 100C to form a semiconductor device, such as the semiconductor device 100 according to some embodiments of the disclosure. The process 100C starts at S101C and proceeds to S110C.

At S110C, in a first region of the semiconductor device, a stack of alternating gate layers and first insulating layers is formed. The first insulating layers in the stack of alternating gate layers and first insulating layers are of a first thickness in the first region. The stack of alternating gate layers and first insulating layer includes a first sub stack of alternating gate layers and insulating layers and a second sub stack of alternating gate layers and insulating layers. In the FIG. 1A example, the stack 160 of alternating gate layers and insulating layers is formed in the staircase region 102 (referred to as the first region in some examples). The insulating layers (also referred to as first insulating layers) in the stack 160 are of about the same thickness that is referred to as the first thickness. The stack 160 includes the lower stack 121 and the upper stack 126. The lower stack 121 can be referred to as the first sub stack, and the upper stack 126 can be referred to as the second sub stack. In some examples, the stack 160 also includes the middle stack 165. The middle stack 165 can be referred to as the third sub stack. In some other examples, the stack 160 does not include the middle stack 165. In an example, each insulating layer (first insulating layer) in the stack 160 is of about 200 Å.

At S120C, in a second region of the semiconductor device, a joint insulating layer (also referred to as a second insulating layer) is formed between the first sub stack of alternating gate layers and insulating layers and the second sub stack of alternating gate layers and the insulating layers. The joint insulating layer is of a second thickness that is larger than the first thickness of the insulating layers in the stack of alternating gate layers and insulating layers. In the FIG. 1A example, the joint insulating layer 125 is formed between the lower stack 121 and the upper stack 125 in the array region 101 (referred to as the second region in some examples). The joint insulating layer 125 is thicker than an insulating layer in the stack 160. In an example, the joint insulating layer 125 can be about 1000 Å. Then, the process proceeds to S199C and terminates.

It is noted that the process 100C is a simplified process. Examples of detail fabrication process will be described with reference to FIG. 2A, FIG. 2B and FIG. 7.

Figure 2A:
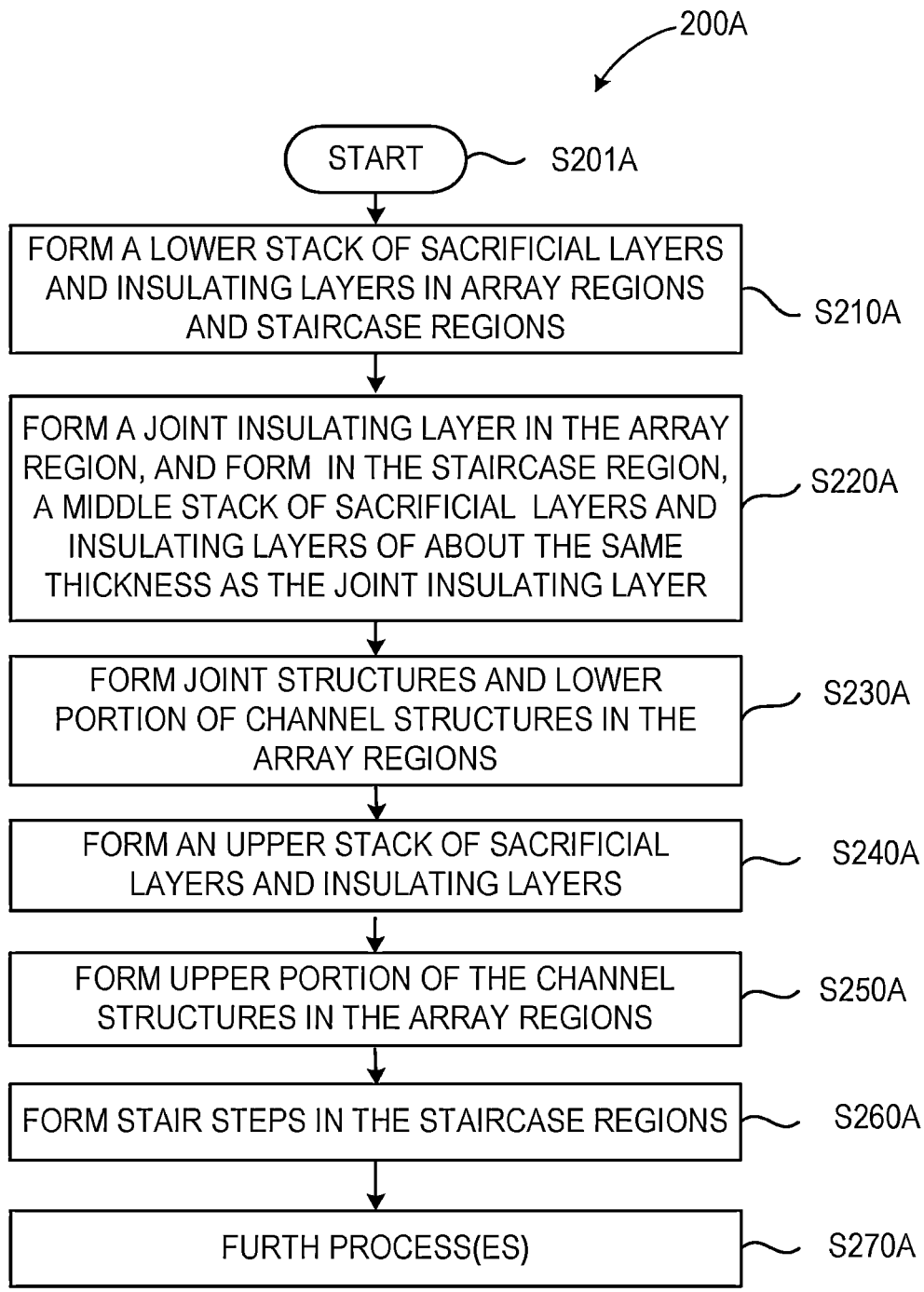
FIG. 2A shows a flow chart outlining a process to form a semiconductor device according to some embodiments of the disclosure.

FIG. 2A shows a flow chart outlining a process 200A to form a semiconductor device, such as the semiconductor device 100 with the portion 110A according to some embodiments of the disclosure. The process starts at S201A and proceeds to S210A.

At S210A, a lower stack of sacrificial layers and insulating layers is formed in array regions and staircase regions. In some examples, sacrificial layers and insulating layers for the lower stack are stacked alternatingly on a substrate. The substrate can be any suitable substrate, such as a silicon (Si) substrate, a germanium (Ge) substrate, a silicon-germanium (SiGe) substrate, and/or a silicon-on-insulator (SOI) substrate. The substrate may be a bulk wafer or an epitaxial layer. In some examples, the insulating layers are made of insulating material(s), such as silicon dioxide, and the like, and the sacrificial layers are made of silicon nitride.

At S220A, a joint insulating layer is formed in the array regions, and a middle stack of sacrificial layers and insulating layers with a total thickness corresponding to the joint insulating layer is formed in the staircase regions. In some embodiments, the middle stack of sacrificial layers and insulating layers is deposited on the lower stack of sacrificial layers and insulating layers. Then, one or more pairs of sacrificial layer and insulating layer are removed from the array regions. Further, the joint insulating layer is formed in the array region. To form the joint insulating layer in the array region, in some examples, insulating material corresponding to the joint insulating layer is deposited and the surface is suitably planarized to remove the insulating material from the staircase region.

The detail process steps to form the joint insulating layer and the middle stack of sacrificial layers and insulating layers will be described in detail with reference to FIGS. 3A-D, FIGS. 4A-D, and FIGS. 5A-D.

At S230A, joint structures and the lower portion of channel structures are formed in the array regions.

In an example, suitably planarization process is performed to obtain a relatively flat surface. Then, photo lithography technology is used to define patterns of channel holes in photoresist and/or hard mask layers, and etch technology is used to transfer the patterns into the joint insulating layer and the lower stack of sacrificial layers and insulating layers. Thus, lower channel holes are formed in the joint insulating layer and the lower stack of sacrificial layers and insulating layers in the array regions.

Then, lower portion of the channel structures are formed in the lower channel holes. In an example, a blocking insulating layer (e.g., silicon dioxide) is formed on the sidewall of lower channel holes for the lower portion of the channel structures, and then the charge storage layer (e.g., silicon nitride), the tunneling insulating layer, the semiconductor layer, and the insulating layer are sequentially stacked from the sidewall.

Further, in an example, for each channel structure, the opening in the joint insulating layer is expanded to be larger than the lower channel hole, and the opening can expose a top portion of the semiconductor layer (also referred to as lower channel layer) in the lower portion of the channel structure. Then, a joint material, such as a semiconductor layer is disposed in the opening of the joint insulating layer to form the joint structure, the joint structure is connected with the lower channel layer in the lower portion of the channel structure.

At S240A, an upper stack of sacrificial layers and insulating layers are formed in the array regions and the staircase regions. In some examples, suitable planarization process is performed, and then sacrificial layers and insulating layers for the upper stack are stacked alternatingly.

At S250A, the upper portion of the channel structures are formed in the array regions. In an example, photo lithography technology is used to define patterns of channel holes in photoresist and/or hard mask layers, and etch technology is used to transfer the patterns into the upper stack of sacrificial layers and insulating layers. Thus, upper channel holes are formed in the upper stack of sacrificial layers and insulating layers in the array regions. In some examples, the upper channel holes expose the joint structure.

Then, upper portion of the channel structures are formed in the upper channel holes. In an example, a blocking insulating layer (e.g., silicon dioxide) is formed on the sidewall of upper channel holes for the upper portion of the channel structures, and then the charge storage layer (e.g., silicon nitride), and the tunneling insulating layer are sequentially stacked from the sidewall.

Before stacking a semiconductor layer, the bottom of the channel holes can be etched to expose the joint structure. Then, a semiconductor layer (also referred to as upper channel layer) is disposed, and semiconductor layer is connected to the joint structure. Thus, the joint structure connects the upper channel layer in the upper portion of the channel structures with the lower channel layer in the lower portion of the channel structures.

At S260A, stair steps are formed in the staircase regions. In some embodiments, the stair steps are formed using etch-trim process and chop process.

In an example, a mask layer is used to form similar stair steps in multiple sections, such as the sections 105, 106 and 107. The mask layer covers the array regions and some portions of the staircase regions. In some embodiments, the mask layer can include a photoresist or carbon-based polymer material, and can be formed using a patterning process such as lithography. In some embodiments, the mask layer can also include a hard mask, such as silicon dioxide, silicon nitride, TEOS, silicon-containing anti-reflective coating (SiARC), amorphous silicon, or polycrystalline silicon. The hard mask can be patterned using etching process such as reactive-ion-etching (RIE) using O2 or CF4 chemistry. Furthermore, the mask layer can include any combination of photoresist and hard mask.

In some embodiments, the stair steps can be formed by applying a repetitive etch-trim process using the mask layer. The repetitive etch-trim process includes multiple cycles of an etching process and a trimming process. During the etching process, a portion of the stack with exposed surface can be removed. In an example, the etch depth equals to a pair of sacrificial layer and insulating layer. In an example, the etching process for the insulating layer can have a high selectivity over the sacrificial layer, and/or vice versa.

In some embodiments, the etching of the stack is performed by an anisotropic etching such as a reactive ion etch (RIE) or other dry etch processes. In some embodiments, the insulating layer is silicon dioxide. In this example, the etching of silicon dioxide can include RIE using fluorine based gases such as carbon-fluorine (CF4), hexafluoroethane (C2F6), CHF3, or C3F6 and/or any other suitable gases. In some embodiments, the silicon dioxide layer can be removed by wet chemistry, such as hydrofluoric acid or a mixture of hydrofluoric acid and ethylene glycol. In some embodiments, a timed-etch approach can be used. In some embodiments, the sacrificial layer is silicon nitride. In this example, the etching of silicon nitride can include RIE using O2, N2, CF4, NF3, Cl2, HBr, BCl3, and/or combinations thereof. The methods and etchants to remove a single layer stack should not be limited by the embodiments of the present disclosure.

The trimming process includes applying a suitable etching process (e.g., an isotropic dry etch or a wet etch) on the mask layer such that the mask layer can be pulled back (e.g., shrink inwardly) laterally in the x-y plane from edges. In some embodiments, the trimming process can include dry etching, such as RIE using O2, Ar, N2, etc.

After trimming the mask layer, one portion of the topmost level of the initial stack corresponding to, for example a stair step, is exposed and the other potion of the topmost level of the initial stack remains covered by the mask layer. The next cycle of etch-trim process resumes with the etching process. After forming the stair steps, the mask layer can be removed.

In an example, by the etch-trim process, 36 stair steps are formed in the upper 36 pairs of sacrificial layer and insulating layer in the sections 105-107. Further, a chop process is performed at different staircase sections to shift the staircase sections to the appropriate layers. In an example, the section 106 and the section 107 are suitably exposed, and a chop process is performed to shift the section 106 and the section 107 to the middle 36 pairs of sacrificial layer and insulating layer. For example, a mask layer is disposed to cover the semiconductor device 100, and then the portion of the mask layer that covers the section 106 and the section 107 is suitably removed to expose the section 106 and the section 107. Then, etch process is performed to remove 36 layer pairs at the section 106 and the section 107.

In some embodiments, the etching of a lay pair (including an insulating layer and a sacrificial layer) at the section 106 and the section 107is performed by an anisotropic etching such as a reactive ion etch (RIE) or other dry etch processes. In some embodiments, the insulating layer is silicon dioxide. In this example, the etching of silicon dioxide can include RIE using fluorine based gases such as carbon-fluorine (CF4), hexafluoroethane (C2F6), CHF3, or C3F6 and/or any other suitable gases. In some embodiments, the silicon dioxide layer can be removed by wet chemistry, such as hydrofluoric acid or a mixture of hydrofluoric acid and ethylene glycol. In some embodiments, a timed-etch approach can be used. In some embodiments, the sacrificial layer is silicon nitride. In this example, the etching of silicon nitride can include RIE using O2, N2, CF4, NF3, Cl2, HBr, BCl3, and/or combinations thereof. The methods and etchants to remove a single layer stack should not be limited by the embodiments of the present disclosure.

Further, a similar chop process is performed at the section 107 to shift the stair steps in the section 107 to the bottom 36 pairs of sacrificial layer and insulating layer.

According to some aspects of the disclosure, thickness of the sacrificial layers and the thickness of the insulating layers in the staircase regions are relatively consistent in the staircase region, thus the chop process can be performed with reduced etch loading effect, and can achieve better stair step profile, to facilitate further contact process in some examples.

At S270A, further process(es) can be performed on the semiconductor device. For example, in a gate-last process, gate line slits (also referred to as slit structures in some examples) are formed. In some embodiments, the gate line slits are etched as trenches in the stack, such as the stack 120, the stack 160, and the like.

Further, real gates are formed. In some embodiments, using the gate line slits, the sacrificial layers can be replaced by the gate layers. In an example, etchants to the sacrificial layers are applied via the gate line slits to remove the sacrificially layers. In an example, the sacrificial layers are made of silicon nitride, and the hot sulfuric acid ($H_2SO_4$) is applied via the gate line slits to remove the sacrificial layers. Further, via the gate line slits, gate stacks to the transistors in the array region are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon dioxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon dioxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

Further, the gate-last process continues to, for example, fill the gate line slits with spacer material (e.g., silicon dioxide) and common source material (e.g., tungsten) to form the slit structure. Further, contacts structures can be formed and metal traces can be formed.

Figure 2B:
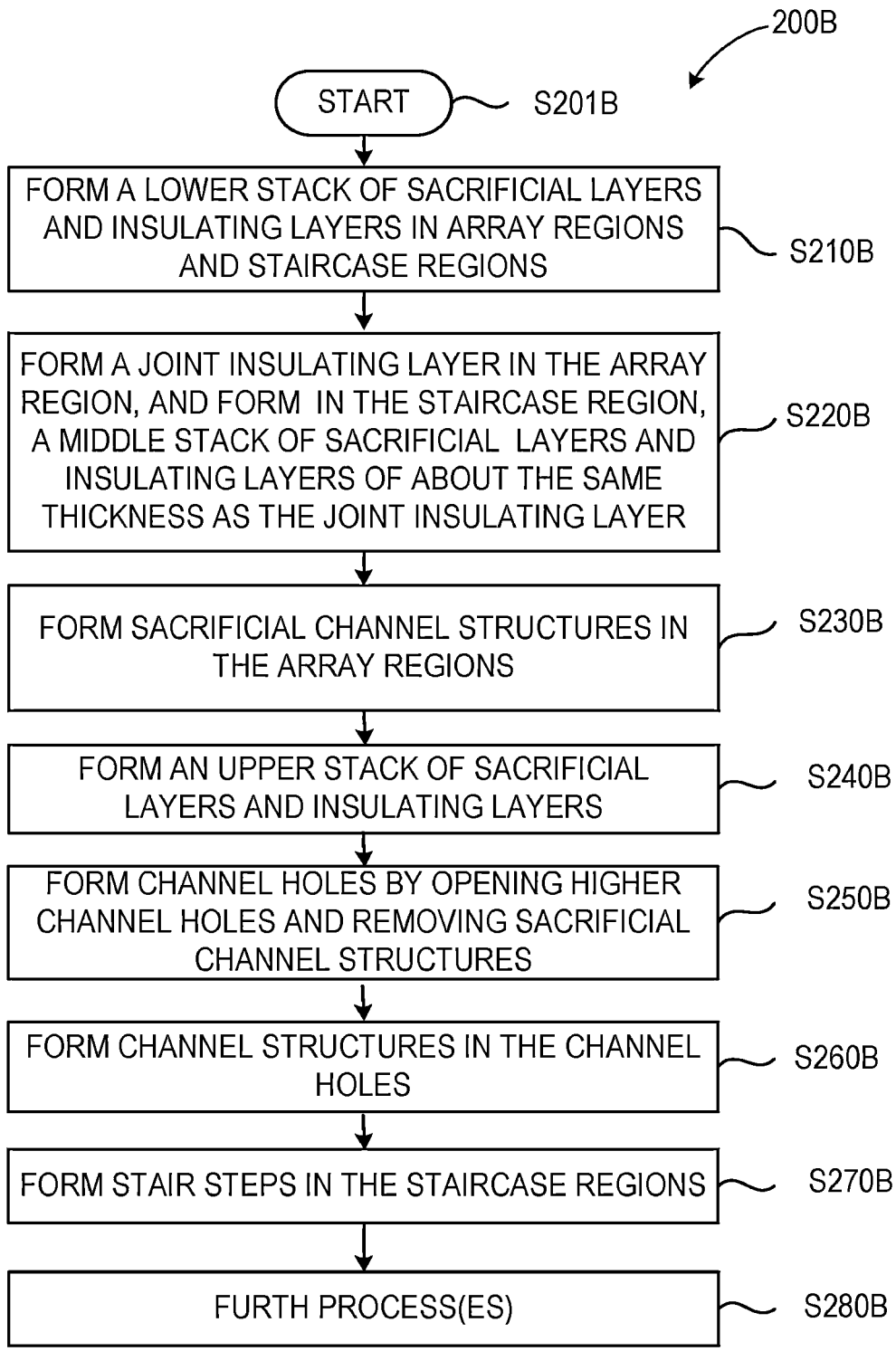
FIG. 2B shows another flow chart outlining a process to form a semiconductor device according to some embodiments of the disclosure.

FIG. 2B shows a flow chart outlining a process 200B to form a semiconductor device, such as the semiconductor device 100 with the portion 110B according to some embodiments of the disclosure. The process starts at S201B and proceeds to S210B.

At S210B, a lower stack of sacrificial layers and insulating layers is formed in array regions and staircase regions. In some examples, sacrificial layers and insulating layers for the lower stack are stacked alternatingly on a substrate. The substrate can be any suitable substrate, such as a silicon (Si) substrate, a germanium (Ge) substrate, a silicon-germanium (SiGe) substrate, and/or a silicon-on-insulator (SOI) substrate. The substrate may be a bulk wafer or an epitaxial layer. In some examples, the insulating layers are made of insulating material(s), such as silicon dioxide, and the like, and the sacrificial layers are made of silicon nitride.

At S220B, a joint insulating layer is formed in the array regions, and a middle stack of sacrificial layers and insulating layers with a total thickness corresponding to the joint insulating layer is formed in the staircase regions. In some embodiments, the middle stack of sacrificial layers and insulating layers is deposited on the lower stack of sacrificial layers and insulating layers. Then, one or more pairs of sacrificial layer and insulating layer are removed from the array regions. Further, the joint insulating layer is formed in the array region. To form the joint insulating layer in the array region, in some examples, insulating material corresponding to the joint insulating layer is deposited and the surface is suitably planarized to remove the insulating material from the staircase region.

The detail process steps to form the joint insulating layer and the middle stack of sacrificial layers and insulating layers will be described in detail with reference to FIGS. 3A-D, FIGS. 4A-D, and FIGS. 5A-D.

At S230B, sacrificial channel structures are formed in the array regions.

In an example, suitably planarization process is performed to obtain a relatively flat surface. Then, photo lithography technology is used to define patterns of channel holes in photoresist and/or hard mask layers, and etch technology is used to transfer the patterns into the joint insulating layer and the lower stack of sacrificial layers and insulating layers. Thus, lower channel holes are formed in the joint insulating layer and the lower stack of sacrificial layers and insulating layers in the array regions.

Then, sacrificial channel structures are formed in the lower channel holes. In some examples, polysilicon material can be deposited in the lower channel holes and on the surface of the array region and the staircase region. Then, planarization process(es), such as a CMP process, a dry etch process, a combination of dry etch and CMP process, and the like, can be performed to remove excess polysilicon material outside of the lower channel holes. In an example, a selective epitaxial growth (SEG) is performed before the deposition of the polysilicon material to form a single crystal silicon plug at the bottom of the lower channel holes, then the polysilicon material is deposited in the lower channel holes. The polysilicon structures in the lower channel holes will be replaced by lower channel structures in later process steps, and thus are referred to as sacrificial channel structures.

At S240B, an upper stack of sacrificial layers and insulating layers are formed in the array regions and the staircase regions. In some examples, suitable planarization process is performed, and then sacrificial layers and insulating layers for the upper stack are stacked alternatingly.

At S250B, channel holes are formed in the combination of the upper stack of sacrificial layers and insulating layers, the joint insulating layer, and the lower stack of the sacrificial layers and insulating layers. In some examples, photo lithography technology is used to define patterns of channel holes in photoresist and/or hard mask layers, and etch technology is used to transfer the patterns into the upper stack of sacrificial layers and insulating layers. Thus, upper channel holes are formed in the upper stack of sacrificial layers and insulating layers in the array regions. In some examples, the sacrificial channel structures can be used as etch stop for the upper channel holes, and the upper channel holes expose the sacrificial channel structures in the joint insulating layer and the lower stack of sacrificial layers and insulating layers. Then, the sacrificial channel structures are removed. Any suitable etch process, such as dry etch process, wet etch process and the like can be used to remove the sacrificial channel structures. Thus, the upper channel holes are combined with the lower channel holes into channel holes that are formed in the combination of the upper stack of sacrificial layers and insulating layers, the joint insulating layer, and the lower stack of the sacrificial layers and insulating layers.

At S260B, channel structures are formed in the channel holes. In an example, a blocking insulating layer (e.g., silicon dioxide) is formed on the sidewall of channel holes, and then the charge storage layer (e.g., silicon nitride), and the tunneling insulating layer are sequentially stacked from the sidewall. Further, a semiconductor layer (also referred to as channel layer) is disposed. The semiconductor layer extends from the higher channel holes into the lower channel holes, and includes a portion formed in an opening of the joint insulating layer, and the portion of the semiconductor layer in the opening of the joint insulating layer can be referred to as a joint structure that connects the upper channel layer (e.g., upper portion of the semiconductor layer) in the upper portion of the channel structures with the lower channel layer (e.g., lower portion of the semiconductor layer) in the lower portion of the channel structures.

At S270B, stair steps are formed in the staircase regions. In some embodiments, the stair steps are formed using etch-trim process and chop process.

In an example, a mask layer is used to form similar stair steps in multiple sections, such as the sections 105, 106 and 107. The mask layer covers the array regions and some portions of the staircase regions. In some embodiments, the mask layer can include a photoresist or carbon-based polymer material, and can be formed using a patterning process such as lithography. In some embodiments, the mask layer can also include a hard mask, such as silicon dioxide, silicon nitride, TEOS, silicon-containing containing anti-reflective coating (SiARC), amorphous silicon, or polycrystalline silicon. The hard mask can be patterned using etching process such as reactive-ion-etching (RIE) using O2 or CF4 chemistry. Furthermore, the mask layer can include any combination of photoresist and hard mask.

In some embodiments, the stair steps can be formed by applying a repetitive etch-trim process using the mask layer. The repetitive etch-trim process includes multiple cycles of an etching process and a trimming process. During the etching process, a portion of the stack with exposed surface can be removed. In an example, the etch depth equals to a pair of sacrificial layer and insulating layer. In an example, the etching process for the insulating layer can have a high selectivity over the sacrificial layer, and/or vice versa.

In some embodiments, the etching of the stack is performed by an anisotropic etching such as a reactive ion etch (RIE) or other dry etch processes. In some embodiments, the insulating layer is silicon dioxide. In this example, the etching of silicon dioxide can include RIE using fluorine based gases such as carbon-fluorine (CF4), hexafluoroethane (C2F6), CHF3, or C3F6 and/or any other suitable gases. In some embodiments, the silicon dioxide layer can be removed by wet chemistry, such as hydrofluoric acid or a mixture of hydrofluoric acid and ethylene glycol. In some embodiments, a timed-etch approach can be used. In some embodiments, the sacrificial layer is silicon nitride. In this example, the etching of silicon nitride can include RIE using O2, N2, CF4, NF3, Cl2, HBr, BCl3, and/or combinations thereof. The methods and etchants to remove a single layer stack should not be limited by the embodiments of the present disclosure.

The trimming process includes applying a suitable etching process (e.g., an isotropic dry etch or a wet etch) on the mask layer such that the mask layer can be pulled back (e.g., shrink inwardly) laterally in the x-y plane from edges. In some embodiments, the trimming process can include dry etching, such as RIE using O2, Ar, N2, etc.

After trimming the mask layer, one portion of the topmost level of the initial stack corresponding to, for example a stair step, is exposed and the other potion of the topmost level of the initial stack remains covered by the mask layer. The next cycle of etch-trim process resumes with the etching process. After forming the stair steps, the mask layer can be removed.

In an example, by the etch-trim process, 36 stair steps are formed in the upper 36 pairs of sacrificial layer and insulating layer in the sections 105-107. Further, a chop process is performed at different staircase sections to shift the staircase sections to the appropriate layers. In an example, the section 106 and the section 107 are suitably exposed, and a chop process is performed to shift the section 106 and the section 107 to the middle 36 pairs of sacrificial layer and insulating layer. For example, a mask layer is disposed to cover the semiconductor device 100, and then the portion of the mask layer that covers the section 106 and the section 107 is suitably removed to expose the section 106 and the section 107. Then, etch process is performed to remove 36 layer pairs at the section 106 and the section 107.

In some embodiments, the etching of a lay pair (including an insulating layer and a sacrificial layer) at the section 106 and the section 107 is performed by an anisotropic etching such as a reactive ion etch (RIE) or other dry etch processes. In some embodiments, the insulating layer is silicon dioxide. In this example, the etching of silicon dioxide can include RIE using fluorine based gases such as carbon-fluorine (CF4), hexafluoroethane (C2F6), CHF3, or C3F6 and/or any other suitable gases. In some embodiments, the silicon dioxide layer can be removed by wet chemistry, such as hydrofluoric acid or a mixture of hydrofluoric acid and ethylene glycol. In some embodiments, a timed-etch approach can be used. In some embodiments, the sacrificial layer is silicon nitride. In this example, the etching of silicon nitride can include RIE using O2, N2, CF4, NF3, Cl2, HBr, BCl3, and/or combinations thereof. The methods and etchants to remove a single layer stack should not be limited by the embodiments of the present disclosure.

Further, a similar chop process is performed at the section 107 to shift the stair steps in the section 107 to the bottom 36 pairs of sacrificial layer and insulating layer.

According to some aspects of the disclosure, thickness of the sacrificial layers and the thickness of the insulating layers in the staircase regions are relatively consistent in the staircase region, thus the chop process can be performed with reduced etch loading effect, and can achieve better stair step profile, to facilitate further contact process in some examples.

At S280B, further process(es) can be performed on the semiconductor device. For example, in a gate-last process, gate line slits (also referred to as slit structures in some examples) are formed. In some embodiments, the gate line slits are etched as trenches in the stack, such as the stack 120, the stack 160, and the like.

Further, real gates are formed. In some embodiments, using the gate line slits, the sacrificial layers can be replaced by the gate layers. In an example, etchants to the sacrificial layers are applied via the gate line slits to remove the sacrificially layers. In an example, the sacrificial layers are made of silicon nitride, and the hot sulfuric acid ($H_2SO_4$) is applied via the gate line slits to remove the sacrificial layers. Further, via the gate line slits, gate stacks to the transistors in the array region are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon dioxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon dioxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

Further, the gate-last process continues to, for example, fill the gate line slits with spacer material (e.g., silicon dioxide) and common source material (e.g., polysilicon, tungsten, etc.) to form the slit structure. Further, contacts structures can be formed and metal traces can be formed.

According to some aspects of the disclosure, various techniques can be used to form, in the staircase region, a middle stack of sacrificial layers and insulating layers having a total thickness corresponding to the joint insulating layer in the array region. In some examples, each of the sacrificial layers has a thickness of about 300 Å, and each of the insulating layers has a thickness of about 200 Å. The joint insulating layer is about 1000 Å, thus two pairs of sacrificial layer and insulating layer are of about the same thickness as the joint insulating layer.

FIGS. 3A-3D show cross-sectional views of a semiconductor device 300 during fabrication according to an embodiment of the disclosure. The semiconductor device 300 includes array regions 301 and staircase regions 302. FIG. 3A-3D show a detail example of S220, fabrication steps are used to form a joint insulating layer in the array regions 301 and form, in the staircase regions 302, a middle stack of sacrificial layers and insulating layers of about the same thickness as the joint insulating layer. The semiconductor device 300 can be further processed to form the semiconductor device 100. In some examples, the insulating layers are made of insulating material(s), such as silicon dioxide, and the like, and the sacrificial layers are made of silicon nitride.

Figure 3A:
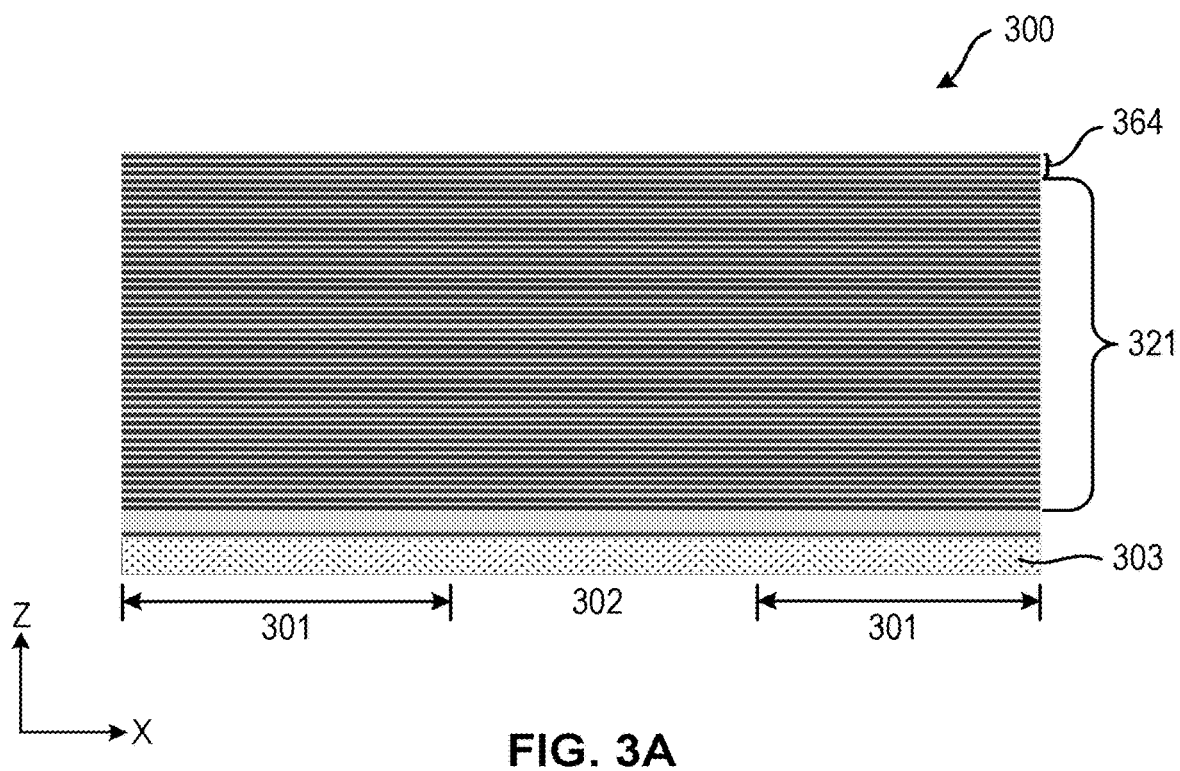
FIGS. 3A-3D show cross-sectional views of a semiconductor device during fabrication according to an embodiment of the disclosure.

FIG. 3A shows a cross-sectional view of the semiconductor device 300 after a deposition of a lower stack 321 of sacrificial layers and insulating layers and an additional stack 364 of sacrificial layers and insulating layers.

In some examples, sacrificial layers and insulating layers for the lower stack are stacked alternatingly on a substrate 303. Then, additional pairs, such as three pairs, of sacrificial layers and insulating layers are stacked alternatingly on the lower stack 321.

Then, the additional stack 364 of sacrificial layers and insulating layers are removed from the array region 301. In an example, lithography technique can be used to cover the staircase regions 302 and expose the array regions 301, and then a suitable etch process can be used to remove three pairs of insulating layer and sacrificial layer from the exposed array regions 301.

Figure 3B:
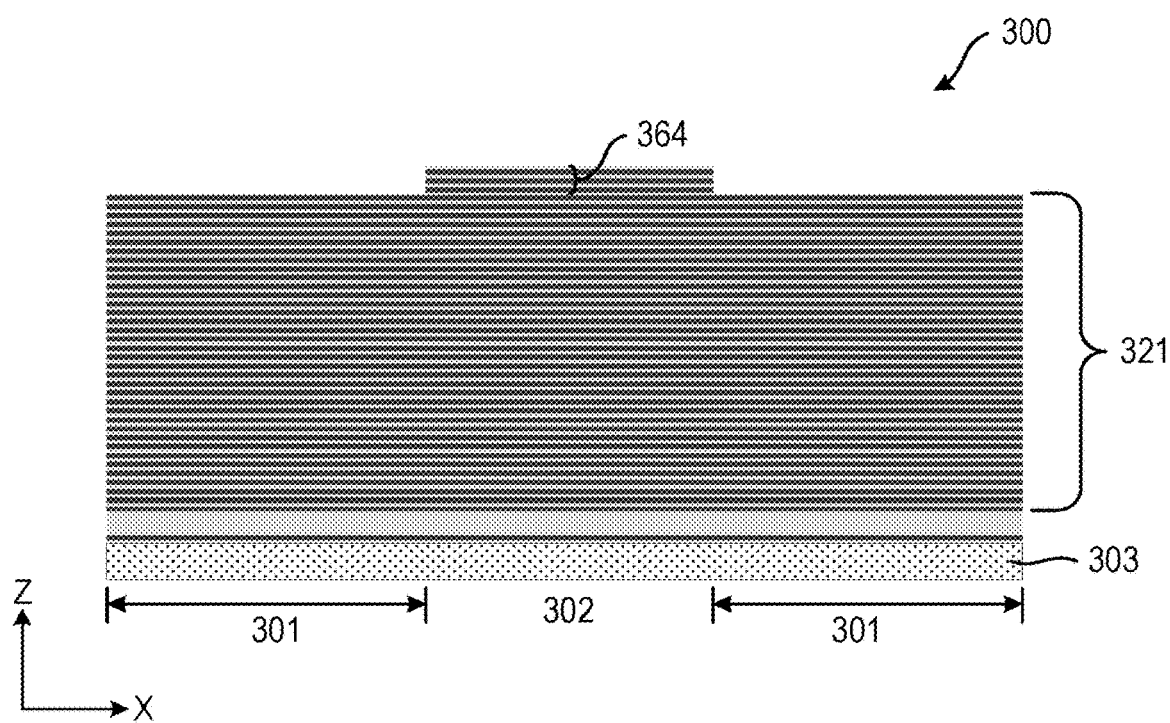

FIG. 3B shows a cross-sectional view of the semiconductor device 300 after the three pairs of insulating layer and sacrificial layer are removed from the array regions 301.

Further, an insulating material 324 (e.g., silicon dioxide), that is referred to as cap layer 324 in the present disclosure, to form the joint insulating layer can be deposited on both the staircase regions 302 and the array regions 301. In an example, the cap layer 324 can have a thickness over 1200 Å, such as 1500 Å and the like.

Figure 3C:
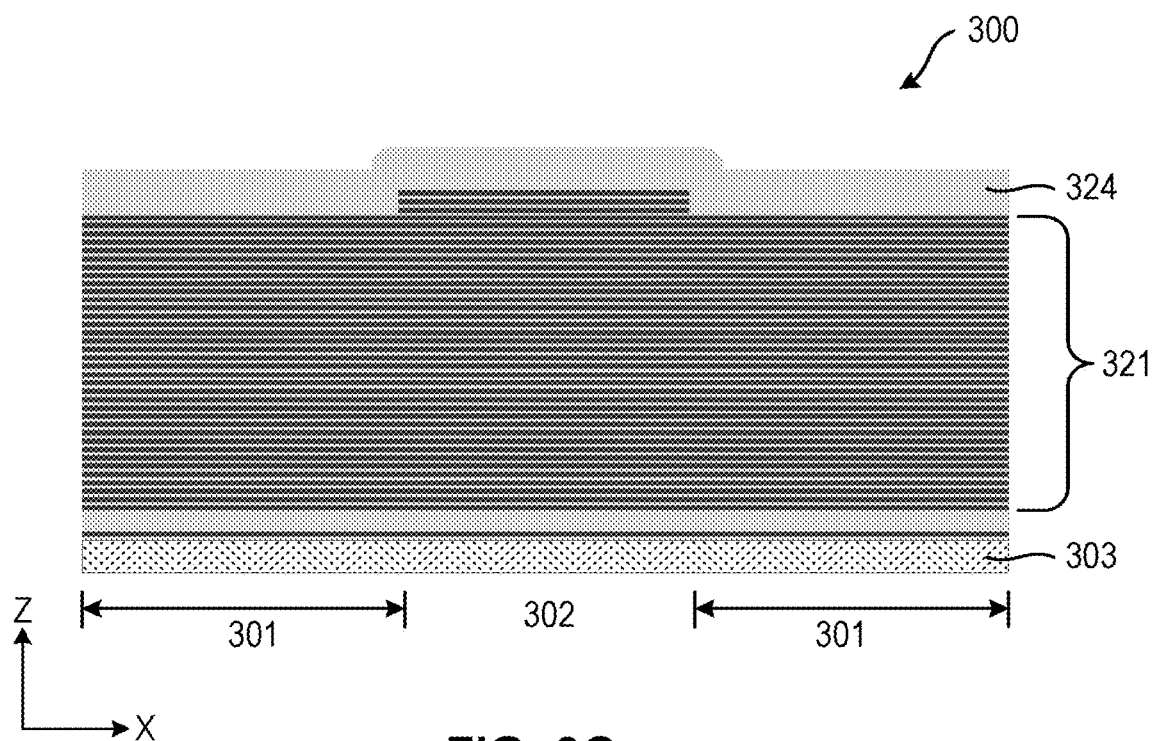

FIG. 3C shows a cross-sectional view of the semiconductor device 300 after the deposition of the cap layer 324.

Then, a chemical mechanical polishing (CMP) process is applied to remove a portion of the cap layer 324 above the top sacrificial layer in both the staircase regions 302 and the array regions 301. The top sacrificial layer is used as a stop layer for the CMP process.

Figure 3D:
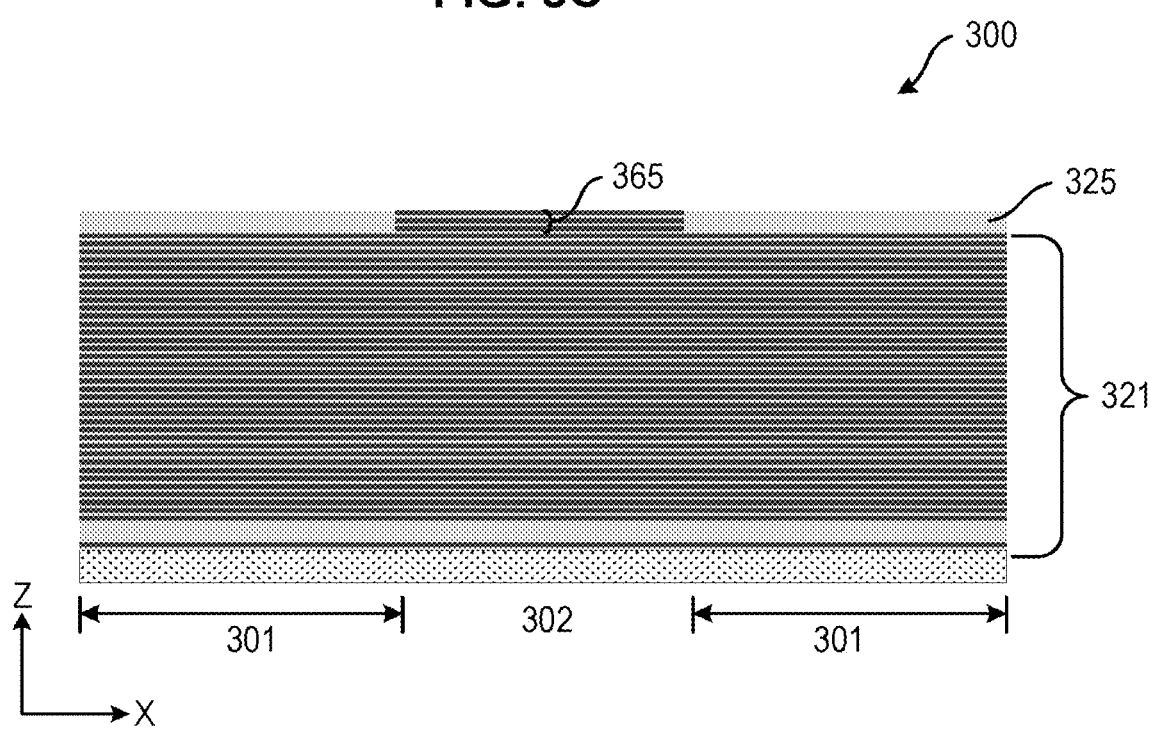

FIG. 3D shows a cross-sectional view of the semiconductor device 300 after the CMP process. In the FIG. 3D example, after CMP, the remaining cap layer 325 has a thickness of about 1200 Å to 1300 Å. The semiconductor device 300 can be further processed, for example according to S230 to form the lower portion of the channel structures and the joint structures.

In some examples, the top sacrificial layer will be removed in a later process, such as a hard mask (e.g., silicon nitride) removal process during a planarization process after the formation of the lower portion of the channel structures, and the cap layer 325 can be further polished during the planarization process. Thus, two pairs of sacrificial layer and insulating layer in the additional stack 364 remain in the staircase region 302, and the remaining cap layer 325 has about the same thickness as the two pairs of sacrificial layer and insulating layer, such as 1000 Å. The remaining cap layer 325 in the array regions forms the joint insulating layer.

FIGS. 4A-4D show cross-sectional views of a semiconductor device 400 during fabrication according to another embodiment of the disclosure. The semiconductor device 400 includes array regions 401 and staircase regions 402. FIG. 4A-4D show a detail example of S220, fabrication steps are used to form a joint insulating layer in the array regions 401 and form, in the staircase regions 402, a middle stack of sacrificial layers and insulating layers having a same thickness as the joint insulating layer. The semiconductor device 400 can be further processed to form the semiconductor device 100. In some examples, the insulating layers are made of insulating material(s), such as silicon dioxide, and the like, and the sacrificial layers are made of silicon nitride.

Figure 4A:
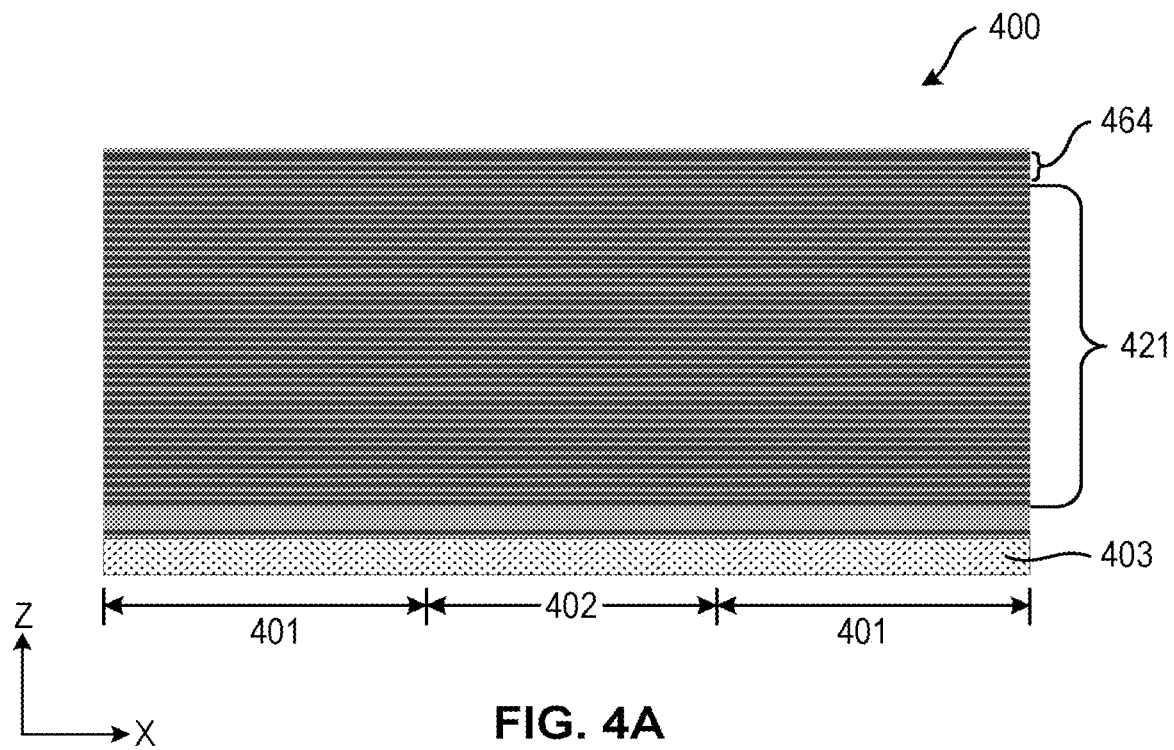
FIGS. 4A-4D show cross-sectional views of a semiconductor device during fabrication according to another embodiment of the disclosure.

FIG. 4A shows a cross-sectional view of the semiconductor device 400 after a deposition of a lower stack 421 of sacrificial layers and insulating layers and an additional stack 464 of sacrificial layers and insulating layers.

In some examples, sacrificial layers and insulating layers for the lower stack 421 are stacked alternatingly on a substrate 403. Then, additional pairs, such as three pairs, of sacrificial layers and insulating layers are stacked alternatingly on the lower stack 421. In an example, the top sacrificial layer is thicker than other sacrificial layers. For example, the other sacrificial layers respectively have a thickness of about 300 Å, and the top sacrificial layer has a thickness of about 400 Å.

Then, the additional stack 464 of sacrificial layers and insulating layers are removed from the array regions 401. In an example, lithography technique can be used to cover the staircase regions 402 and expose the array regions 401, and then a suitable etch process can be used to remove three pairs of insulating layer and sacrificial layer from the exposed array regions 401.

Figure 4B:
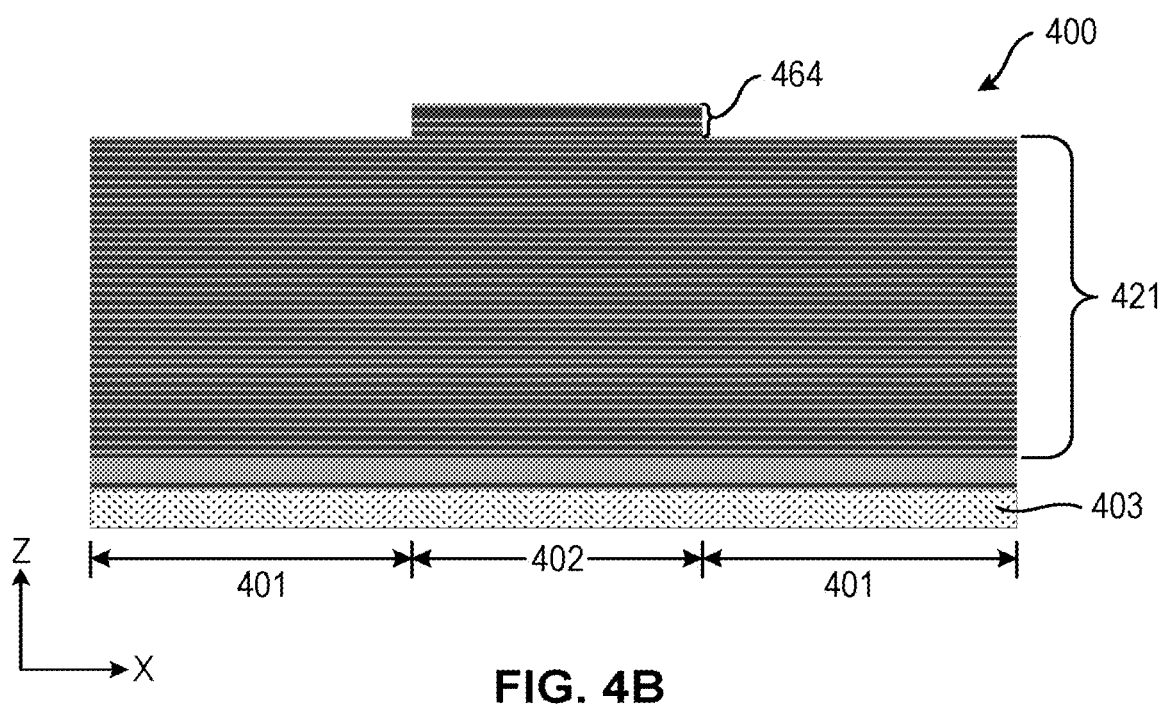

FIG. 4B shows a cross-sectional view of the semiconductor device 400 after the three pairs of insulating layer and sacrificial layer are removed from the array regions 401.

Further, a joint insulating layer 424 (e.g., silicon dioxide) can be deposited on both the staircase regions 402 and the array regions 401. In some examples, the joint insulating layer 424 has a thickness of about 1000 Å. Further, a protecting layer 427 (e.g., silicon nitride) can be deposited on both the staircase regions 402 and the array regions 401. In an example, the protecting layer 427 has a thickness of about 390 Å.

Figure 4C:
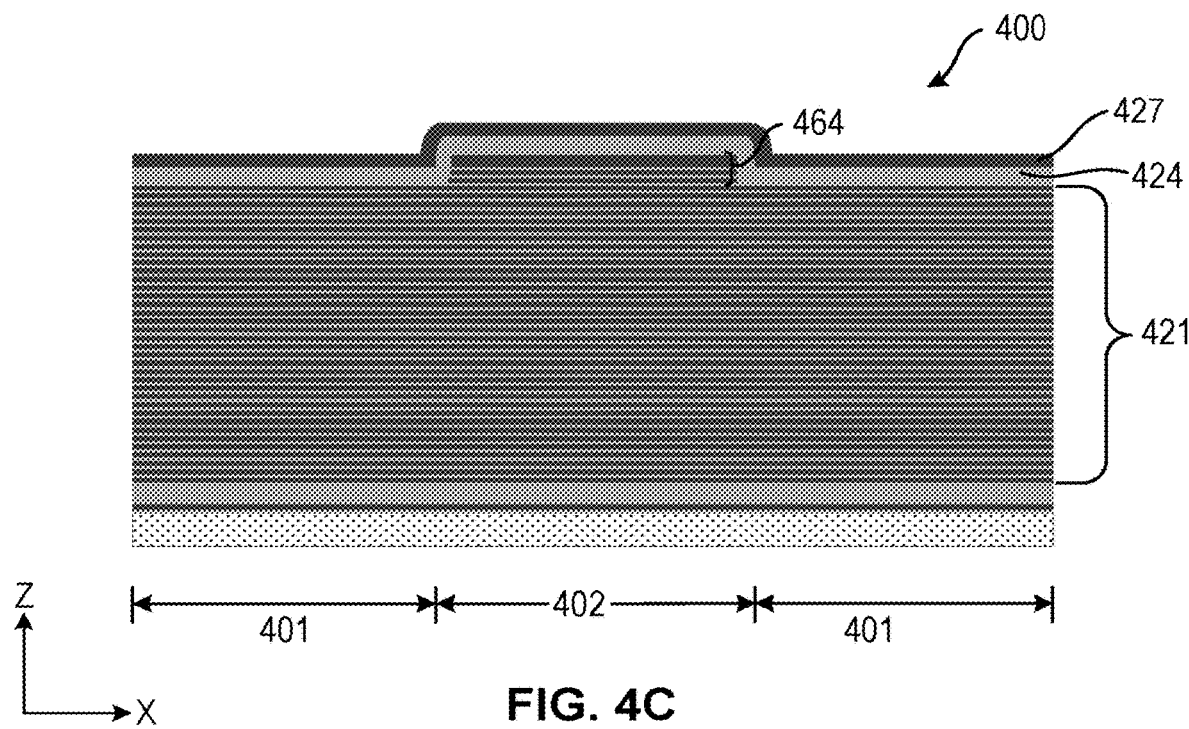

FIG. 4C shows a cross-sectional view of the semiconductor device 400 after the deposition of the joint insulating layer 424 and the protecting layer 427.

Then, a CMP process is applied to remove the joint insulating layer 424 in the staircase region 402. In an example, the top sacrificial layer of the middle stack 464 in the staircase regions 402 and the protecting layer 427 in the array regions 401 can be used as polish stop for the CMP process.

Figure 4D:
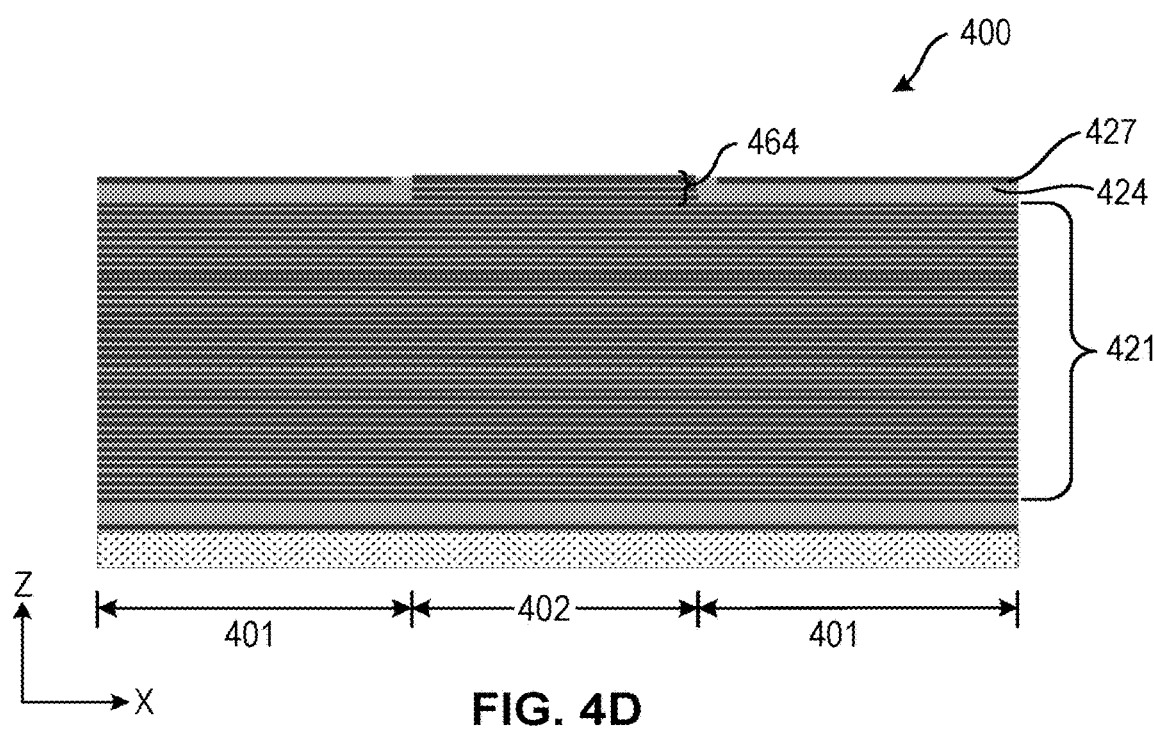

FIG. 4D shows a cross-sectional view of the semiconductor device 400 after the CMP process. The semiconductor device 400 can be further processed, for example according to S230 to form the lower portion of the channel structures and the joint structures.

In some examples, the remaining of the top sacrificial layer and the stop layer will be removed in a later process, such as a hard mask (e.g., silicon nitride) removal process during a planarization process after the formation of the lower portion of the channel structures. Thus, two pairs of sacrificial layer and insulating layer in the additional stack 464 remain in the staircase region 402, and the joint insulating layer has about the same thickness, such as 1000 Å formed in the array regions 401.

It is noted that, in the FIGS. 4A-4D example, the top sacrificial layer in the staircase regions 401 and the protecting layer 427 in the array regions 402 are used as CMP stop layer for the CMP process. The protecting layer 427 can protect the joint insulating layer from the CMP process, thus the joint insulating layer can have a relatively uniform thickness in the array regions 401.

FIG. 5A-5D show cross-sectional views of a semiconductor device 500 during fabrication according to an embodiment of the disclosure. The semiconductor device 500 includes array regions 501 and staircase regions 502. FIG. 5A-5D show a detail example of S220, fabrication steps are used to form a joint insulating layer in the array regions 501 and form, in the staircase regions 502, a middle stack of sacrificial layers and insulating layers of about the same thickness as the joint insulating layer. The semiconductor device 500 can be further process to form the semiconductor device 100. In some examples, the insulating layers are made of insulating material(s), such as silicon dioxide, and the like, and the sacrificial layers are made of silicon nitride.

Figure 5A:
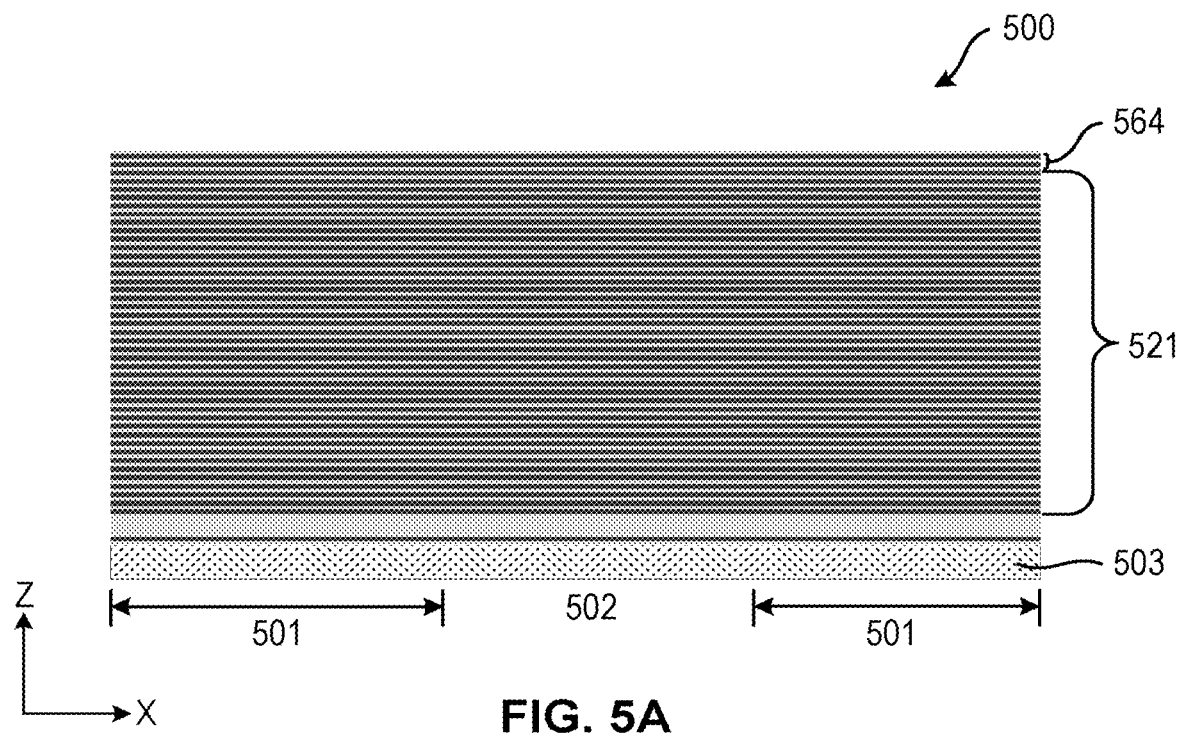
FIGS. 5A-5D show cross-sectional views of a semiconductor device during fabrication according to another embodiment of the disclosure.

FIG. 5A shows a cross-sectional view of the semiconductor device 500 after a deposition of a lower stack 521 of sacrificial layers and insulating layers and an additional stack 564 of sacrificial layers and insulating layers.

In some examples, sacrificial layers and insulating layers for the lower stack 521 are stacked alternatingly on a substrate 503. Then, additional pairs, such as two pairs, of sacrificial layers and insulating layers are stacked alternatingly on the lower stack 521.

Further, the additional pairs of sacrificial layers and insulating layers are removed from the array regions 501. In an example, lithography technique can be used to cover the staircase regions and expose the array regions, and then a suitable etch process can be used to remove two pairs of insulating layer and sacrificial layer from the exposed array regions 501.

Figure 5B:
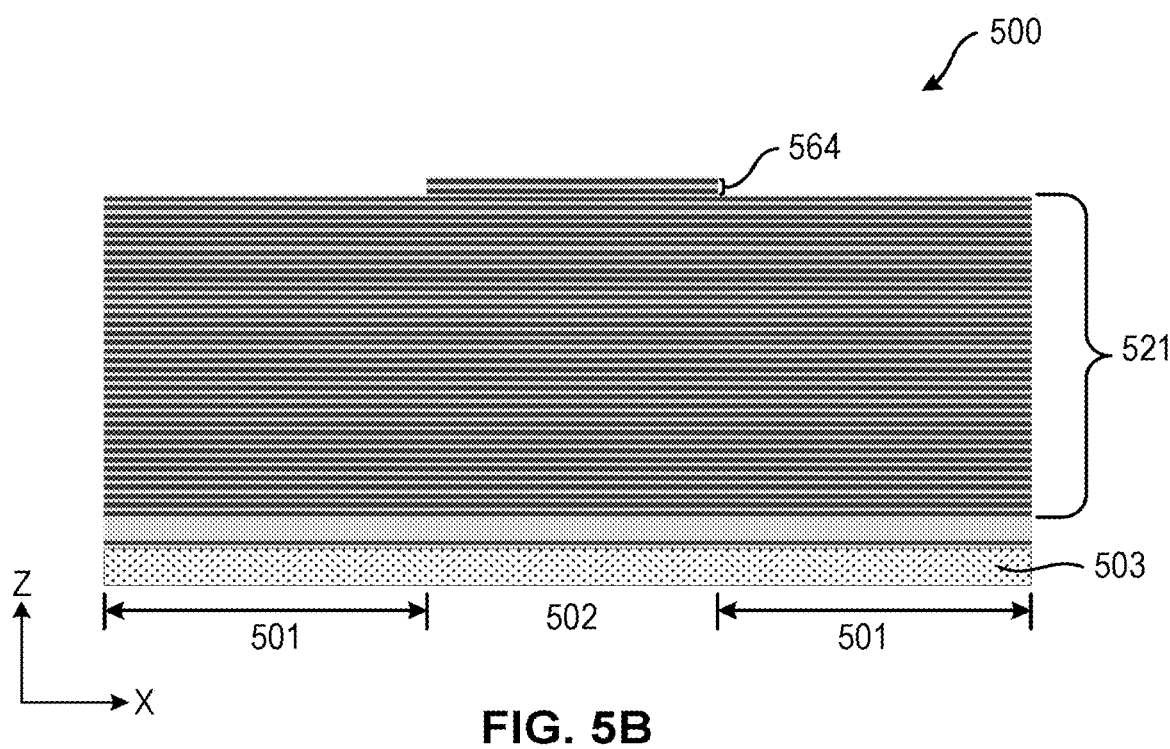

FIG. 5B shows a cross-sectional view of the semiconductor device 500 after the two pairs of insulating layer and sacrificial layer are removed from the array regions 501.

Further, a joint insulating layer 524 (e.g., silicon dioxide) can be deposited on both the staircase regions and the array regions. In an example, the joint insulating layer 524 can have a thickness about 1200 Å.

Figure 5C:
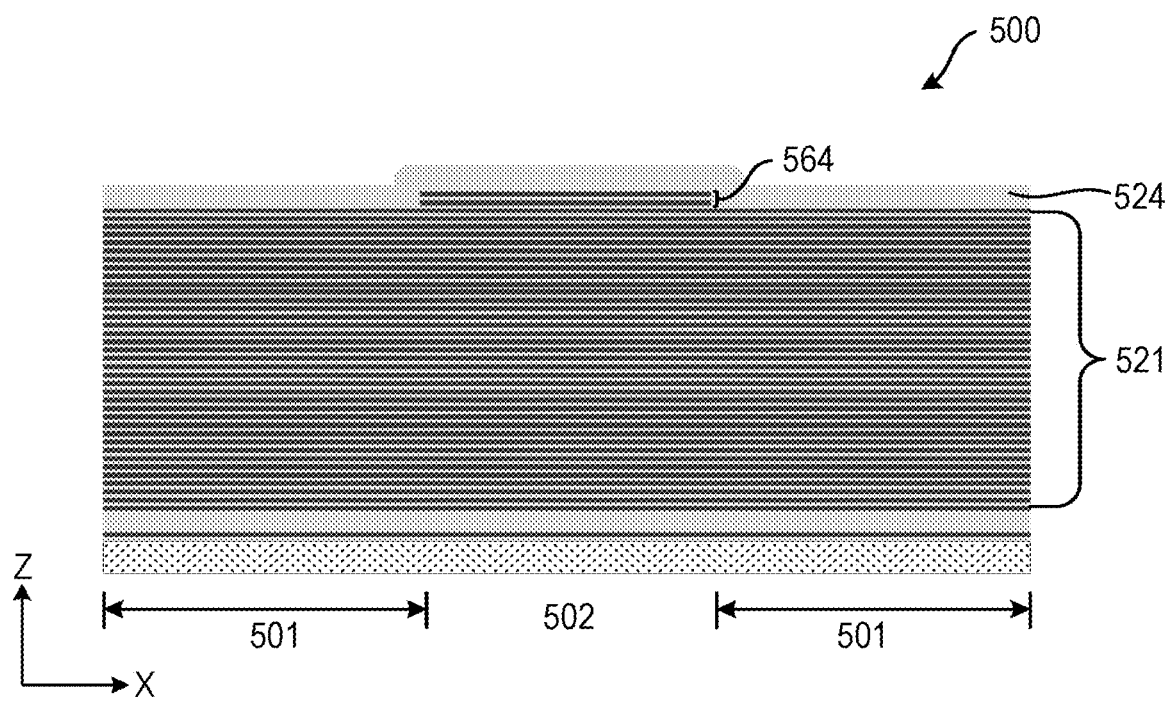

FIG. 5C shows a cross-sectional view of the semiconductor device 500 after the deposition of the joint insulating layer 524.

Then, an etch back process is applied to remove a portion of the joint insulating layer 524 above the top sacrificial layer in the staircase region. In an example, lithography technique is applied to cover the array regions 501 and expose the staircase regions 502, and an etch process is applied to remove a portion of the joint insulating layer 524 in the staircase regions 502. In an example, the etch process is suitably controlled, thus the remaining joint insulating layer 524 in the staircase regions 502 is leveled with the joint insulating layer 524 in the array region 501.

Figure 5D:
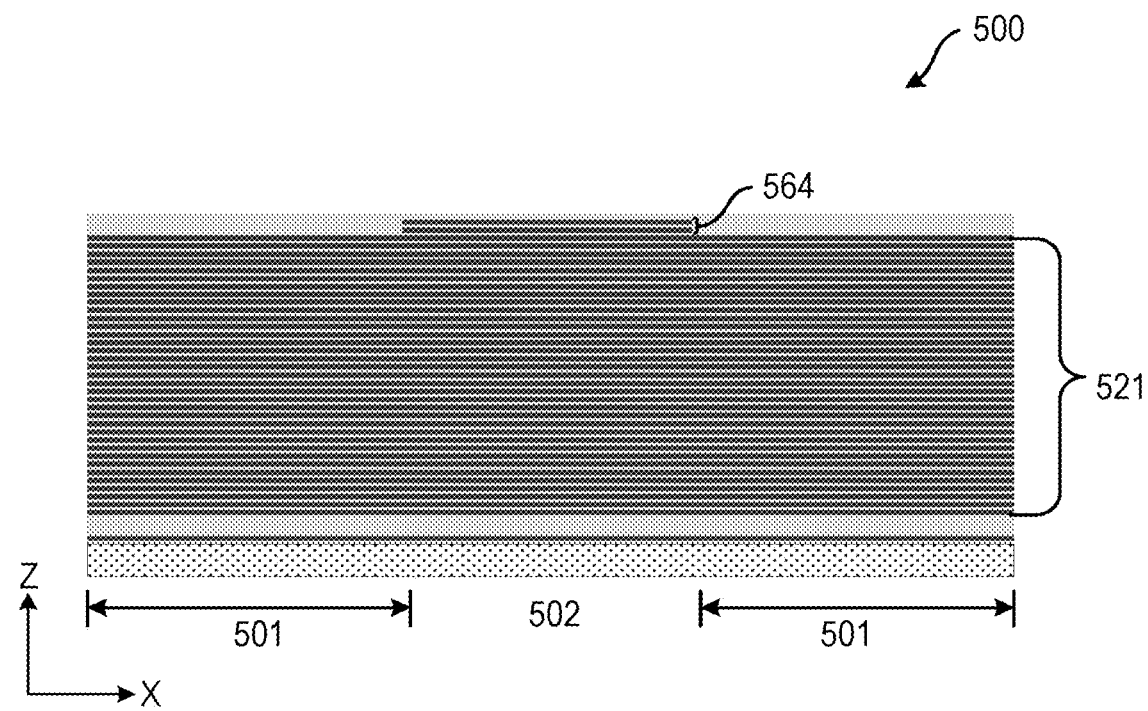

FIG. 5D shows a cross-sectional view of the semiconductor device 500 after the etch back. In the FIG. 5D example, after etch back, the joint insulating layer 524 in the array regions 501 has a thickness of about 1200 Å. In the staircase regions 502, the remaining joint insulating layer in the staircase region 502 has a thickness of about 200 Å, and two pairs of insulating layer and sacrificial layer have a thickness about 1000 Å. Thus, the surface of the array regions 501 is leveled with the surface of the staircase regions 502. The semiconductor device 500 can be further processed, for example according to S230 to form the lower portion of the channel structures and the joint structures.

In the FIG. 5A-5D example, the etch back process is used and no CMP is needed.

FIG. 6A-6E show cross-sectional views of a semiconductor device 600 during fabrication according to an embodiment of the disclosure. The semiconductor device 600 includes array regions 601 and staircase regions 602. FIG. 6A-6E show a detail example of S220, fabrication steps are used to form a joint insulating layer in the array regions 601 and form, in the staircase regions 602, a middle stack of sacrificial layers and insulating layers of about the same thickness as the joint insulating layer. The semiconductor device 600 can be further process to form the semiconductor device 100. In some examples, the insulating layers are made of insulating material(s), such as silicon dioxide, and the like, and the sacrificial layers are made of silicon nitride.

Figure 6A:
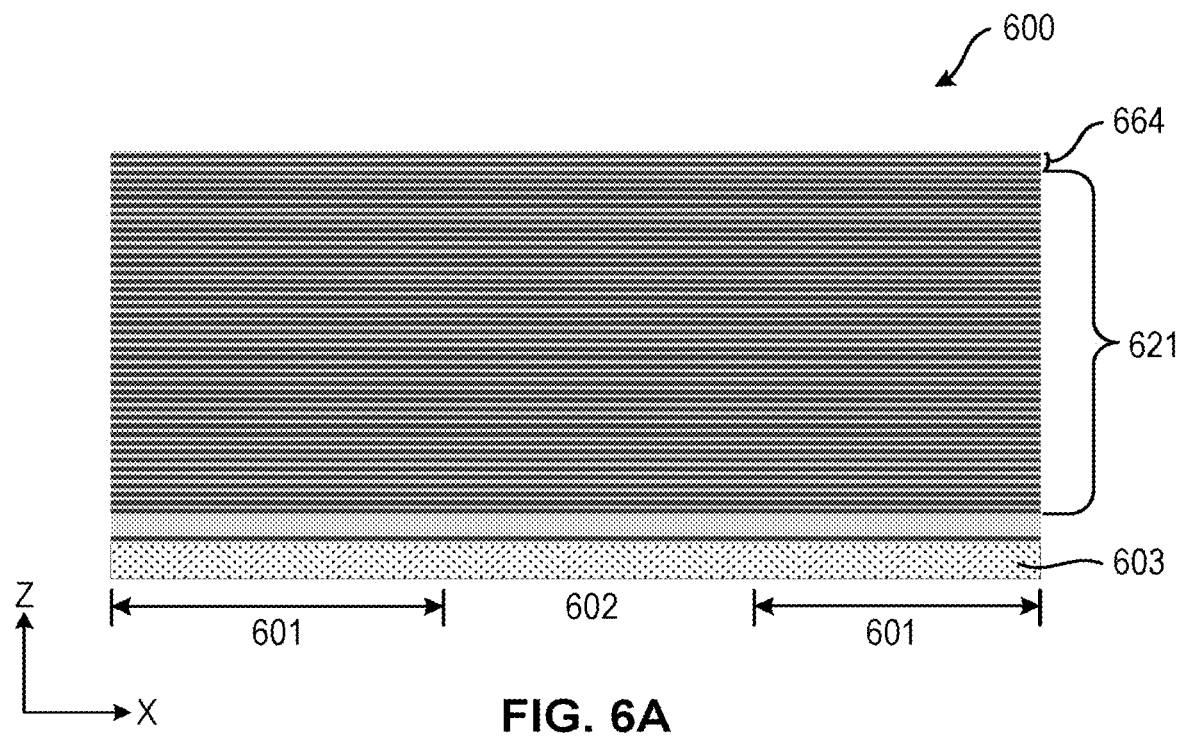
FIG. 6A-6E show cross-sectional views of a semiconductor device during fabrication according to another embodiment of the disclosure.

FIG. 6A shows a cross-sectional view of the semiconductor device 600 after a deposition of a lower stack 621 of sacrificial layers and insulating layers and an additional stack 664 of sacrificial layers and insulating layers.

In some examples, sacrificial layers and insulating layers for the lower stack 621 are stacked alternatingly on a substrate 603. Then, additional pairs, such as two pairs, of sacrificial layers and insulating layers are stacked alternatingly on the lower stack 621.

Further, the additional pairs of sacrificial layers and insulating layers are removed from the array regions 601. In an example, lithography technique can be used to cover the staircase regions and expose the array regions, and then a suitable etch process can be used to remove two pairs of insulating layer and sacrificial layer from the exposed array regions 601.

Figure 6B:
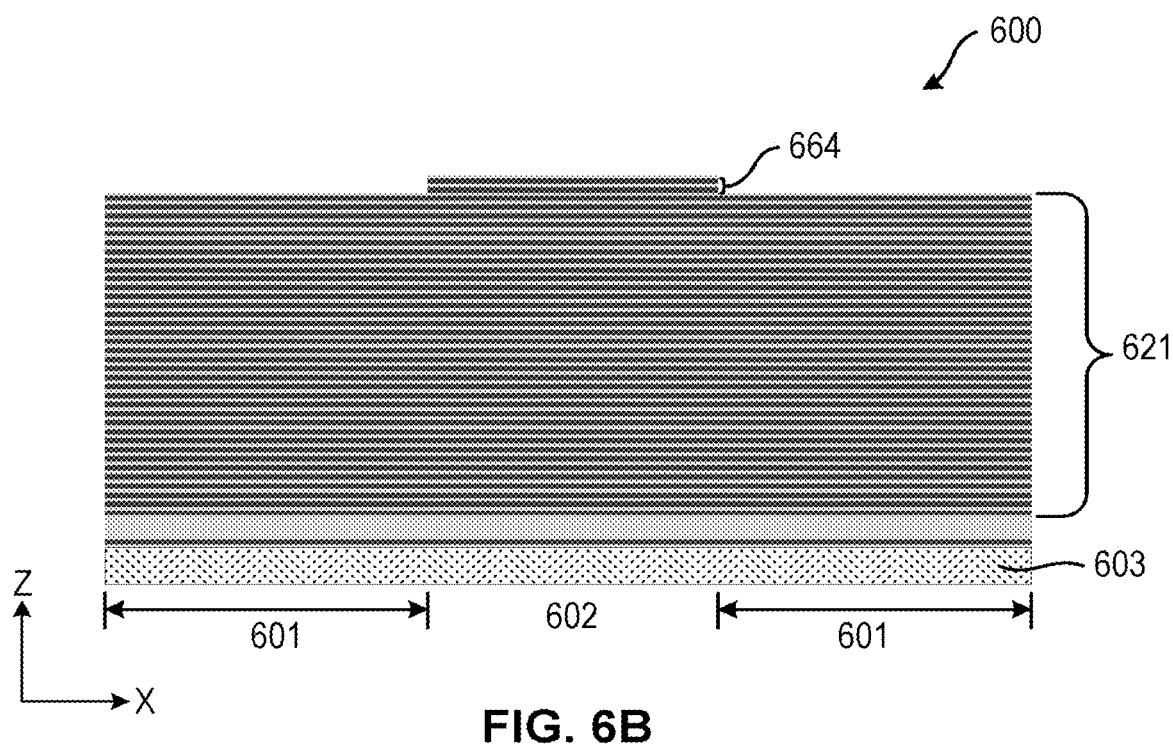

FIG. 6B shows a cross-sectional view of the semiconductor device 600 after the two pairs of insulating layer and sacrificial layer are removed from the array regions 601. It is noted that the additional stack 664 of sacrificial layers and insulating layers (e.g., the two pairs of insulating layer and sacrificial layer) are still in the staircase region 602.

Further, a joint insulating layer 624 (e.g., silicon dioxide) can be deposited on both the staircase regions and the array regions. In an example, the joint insulating layer 624 can have a higher thickness than final thickness. For example, a preferred final thickness is about 1200 Å, and the deposited joint insulating layer 624 at this stage has a thickness about 1800 Å.

Figure 6C:
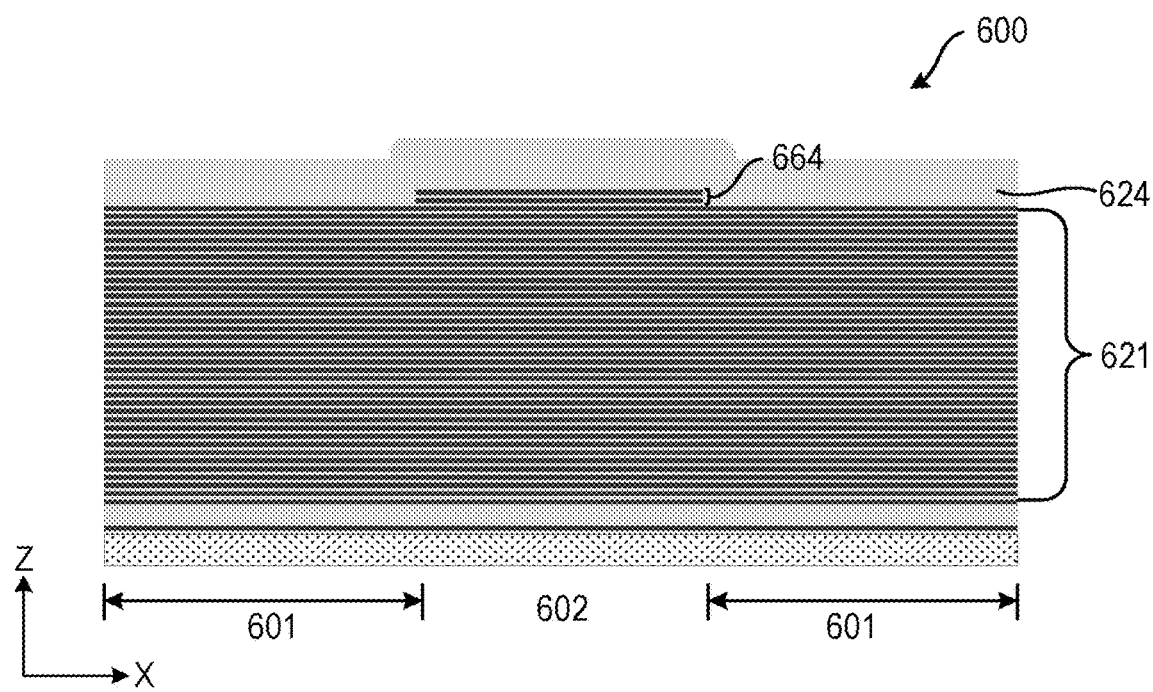

FIG. 6C shows a cross-sectional view of the semiconductor device 600 after the deposition of the joint insulating layer 624.

Then, an etch process is applied to remove a portion of the joint insulating layer 624 above the top sacrificial layer in the staircase region 602. In an example, lithography technique is applied to cover the array regions 601 and expose the staircase regions 602, and an etch process is applied to remove a portion of the joint insulating layer 624 in the staircase regions 602.

Figure 6D:
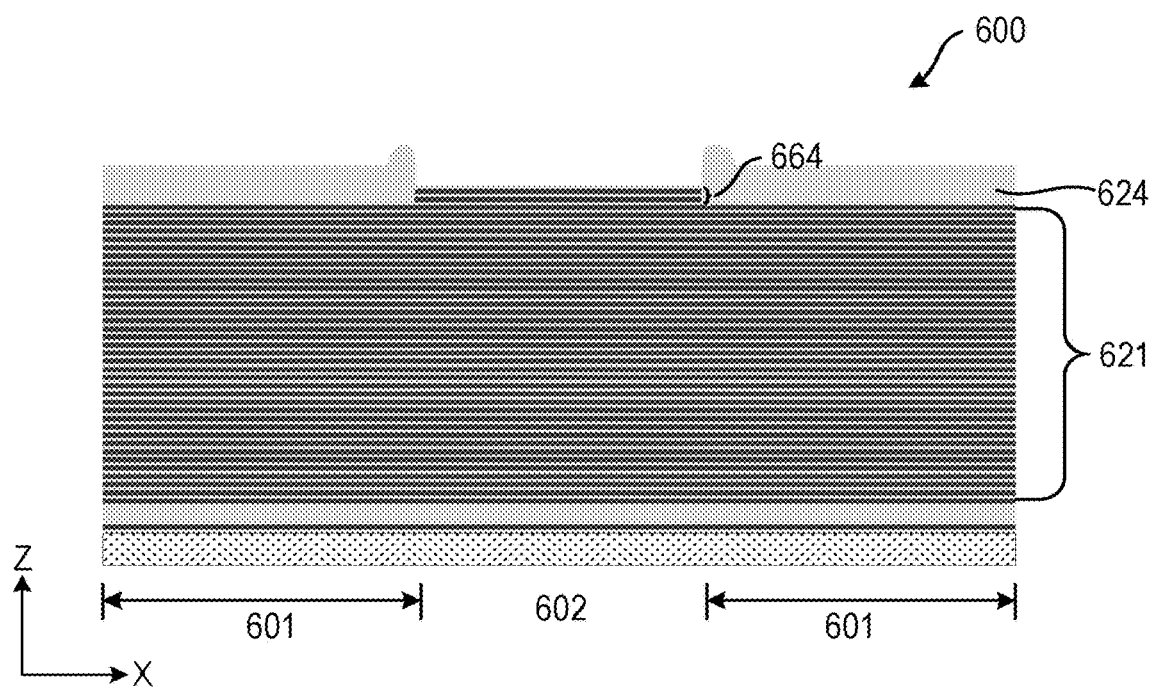

FIG. 6D shows a cross-sectional view of the semiconductor device 600 after the etch process. In the FIG. 6D example, after the etch process, the joint insulating layer 624 in the array regions 601 has a thickness of about 1800 Å. In the staircase regions 602, the remaining joint insulating layer in the staircase region 602 can have a thickness of about 200 Å, and two pairs of insulating layer and sacrificial layer have a thickness about 1000 Å.

Further, a suitable CMP process can be performed to level the joint insulating layer 624 in the array regions 601 with the staircase region 601. For example, the joint insulating layer 624 in the array region 601 is about 1200 Åafter the CMP process.

Figure 6E:
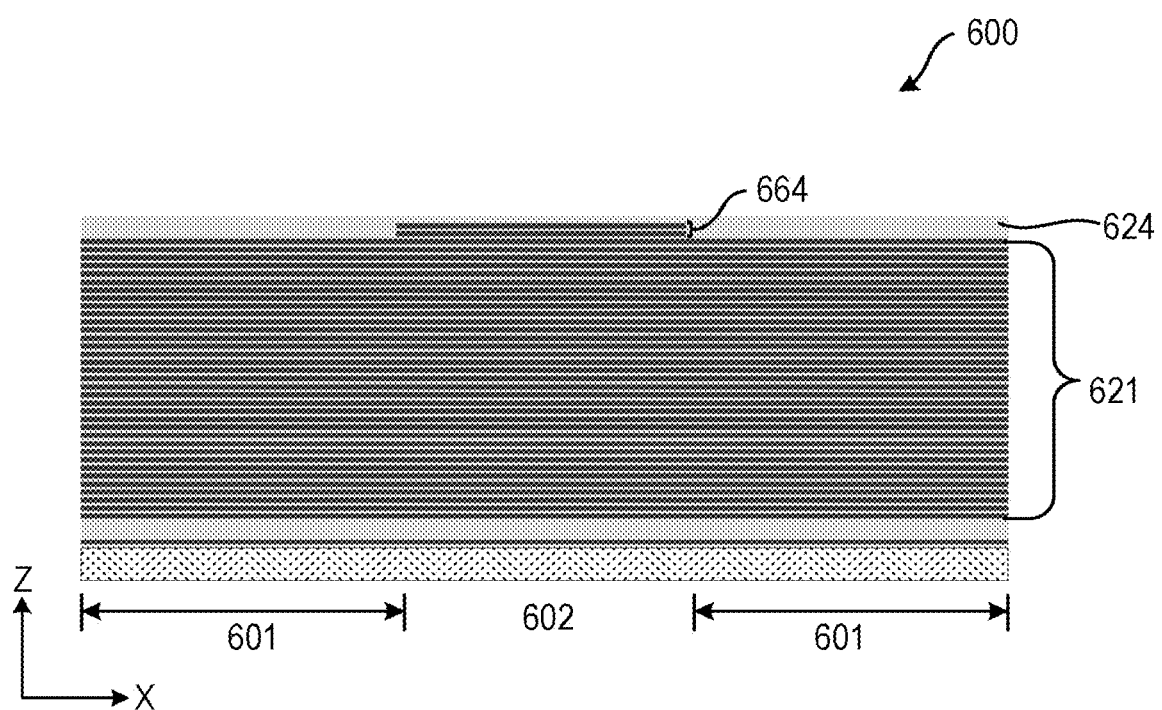

FIG. 6E shows a cross-sectional view of the semiconductor device 600 after the CMP process. In the FIG. 6E example, after the CMP process, the joint insulating layer 624 in the array regions 601 has a thickness of about 1200 Å. In the staircase regions 602, the remaining joint insulating layer in the staircase region 502 has a thickness of about 200 Å, and two pairs of insulating layer and sacrificial layer have a thickness about 1000 Å. Thus, the surface of the array regions 601 is leveled with the surface of the staircase regions 602. The semiconductor device 600 can be further processed, for example according to S230 to form the lower portion of the channel structures and the joint structures.

It is noted that, in some embodiments, in the staircase regions, the upper stack of sacrificial layers and insulating layers is directly stacked on the lower stack of sacrificial layers and insulating layers.

Figure 7:
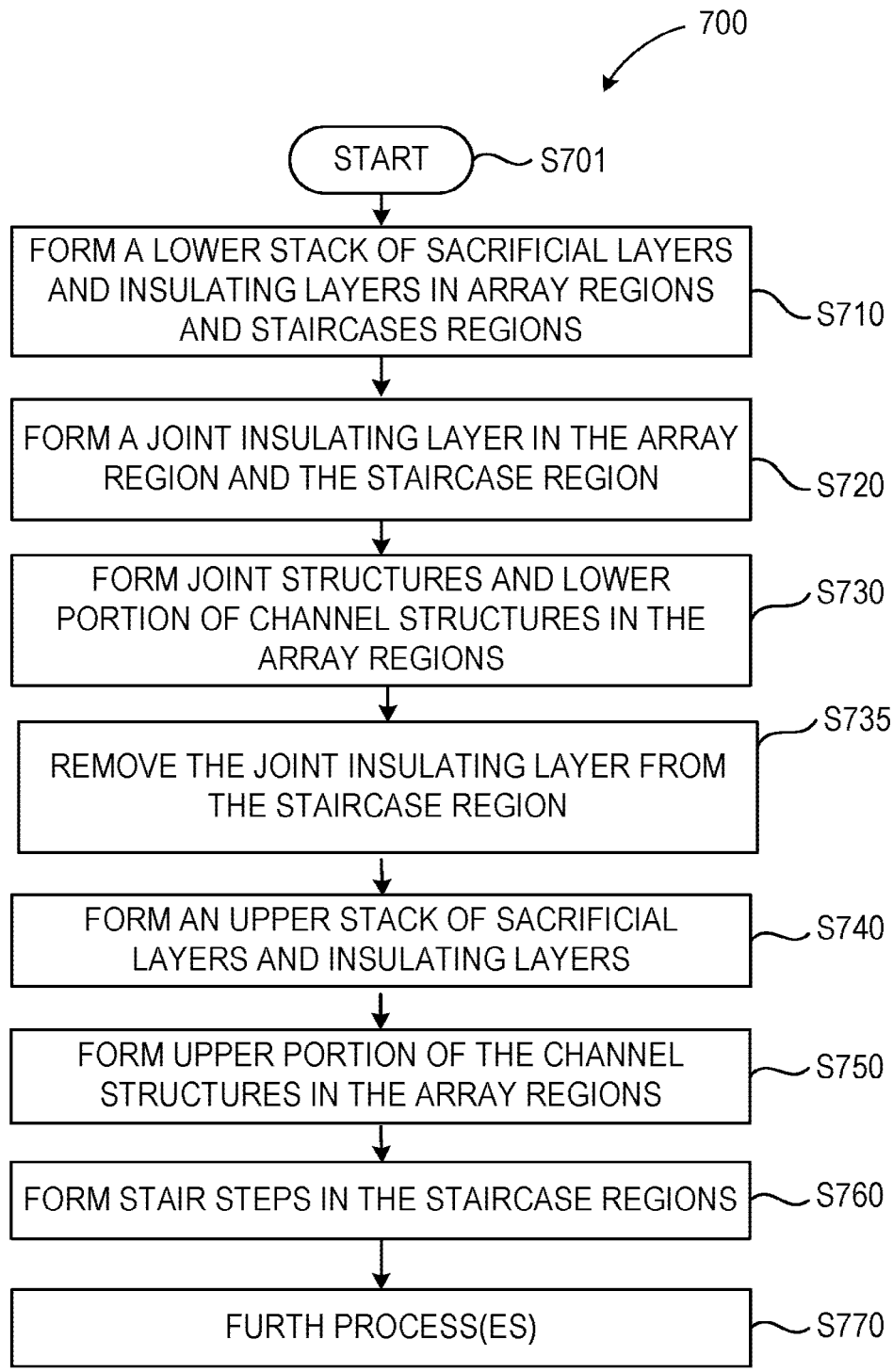
FIG. 7 shows a flow chart outlining another process to form a semiconductor device according to some embodiments of the disclosure.
Figure 8A:
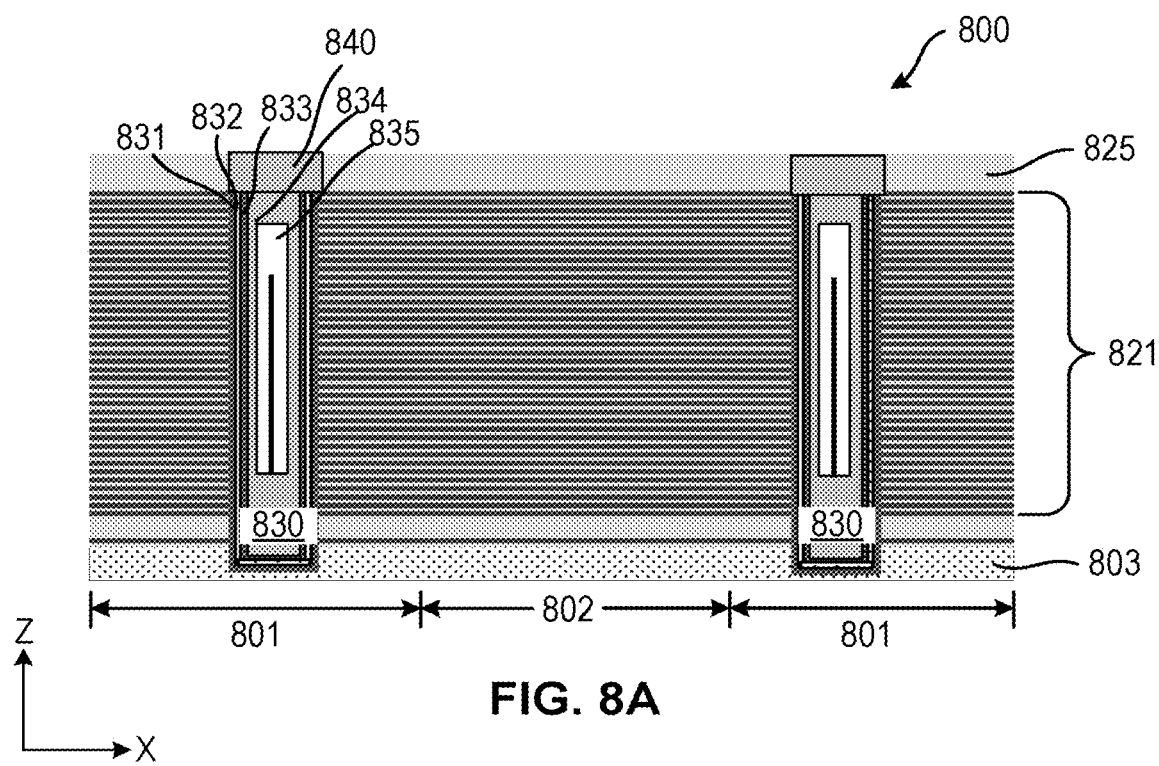
FIGS. 8A-8C show cross-sectional views of a semiconductor device during fabrication according to another embodiment of the disclosure.
Figure 8B:
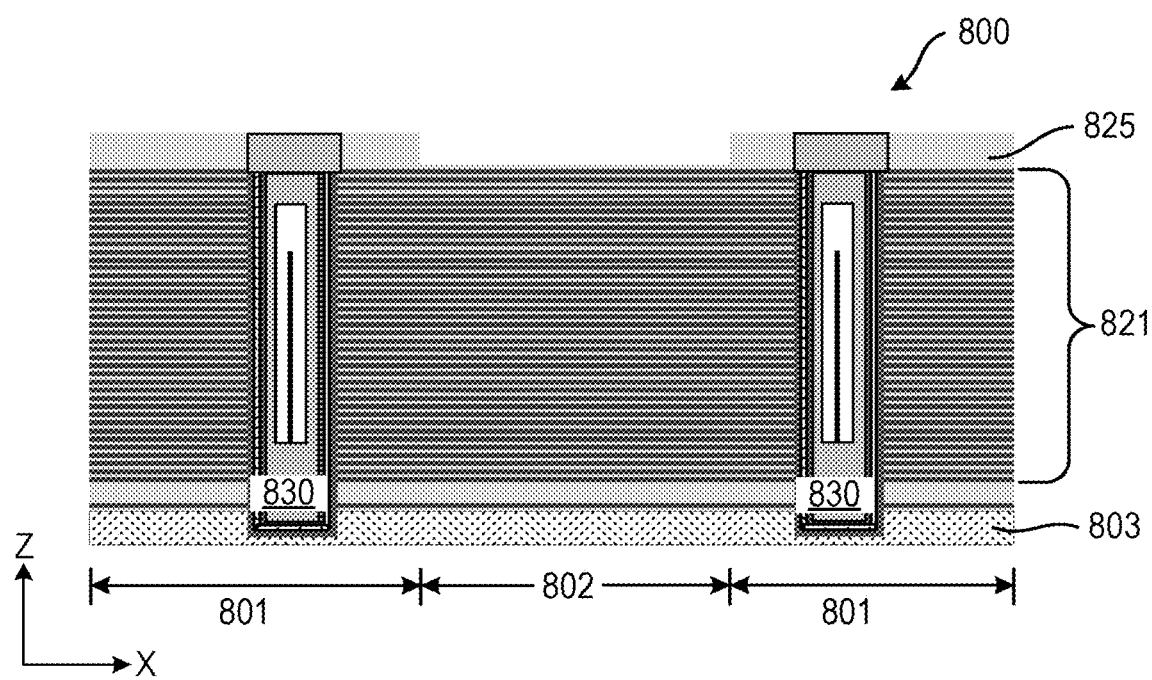
Figure 8C:
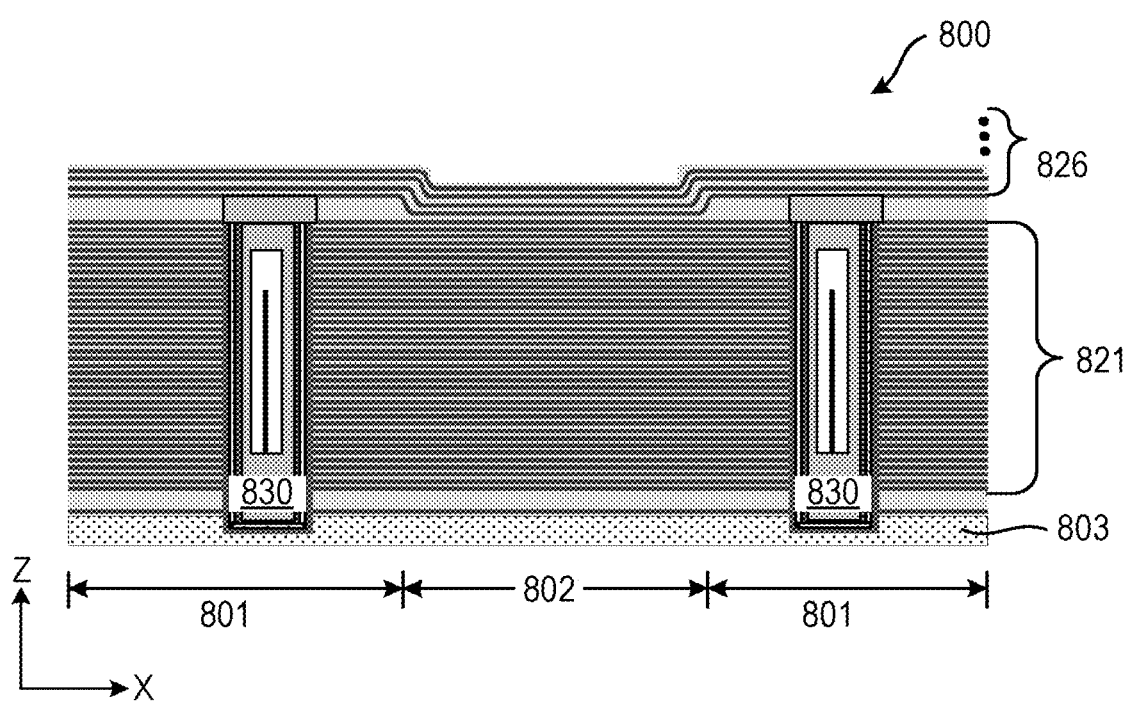

FIG. 7 shows another flow chart outlining a process 700 to form a semiconductor device, such as the semiconductor device 100 according to some embodiments of the disclosure. FIG. 8A-8C show cross-sectional views of a semiconductor device 800 during fabrication according to some embodiments of the disclosure. The process starts at S701 and proceeds to S710.

At S710, a lower stack of sacrificial layers and insulating layers are formed in array regions and staircase regions. Similar to S210, sacrificial layers and insulating layers for the lower stack are stacked alternatingly on a substrate. In some examples, the insulating layers are made of insulating material(s), such as silicon dioxide, and the like, and the sacrificial layers are made of silicon nitride.

At S720, a joint insulating layer is formed in the array regions and in the staircase regions.

At S730, joint structures and lower portion of channel structures are formed in the array regions.

In an example, suitably planarization process is performed to obtain a relatively flat surface. Then, photo lithography technology is used to define patterns of channel holes in photoresist and/or hard mask layers, and etch technology is used to transfer the patterns into the joint insulating layer and the lower stack of sacrificial layers and insulating layers. Thus, lower channel holes are formed in the joint insulating layer and the lower stack of sacrificial layers and insulating layers in the array regions.

Then, lower portion of the channel structures are formed in the lower channel holes. It is noted that any suitable channel structure technology can be used. In some embodiments, source terminals of the channel structures can be formed using selective epitaxial growth (SEG) technology, thus the lower portion of the channel structures are formed compatible with the SEG technology accordingly. In some embodiments, source terminals of the channel structures can be formed using sidewall SEG (SWS) technology, and the lower portion of the channel structures are formed compatible with the SWS technology. In an example that is compatible with the SWS technology, a blocking insulating layer (e.g., silicon dioxide) is formed on the sidewall of lower channel holes for the lower portion of the channel structures, and then the charge storage layer (e.g., silicon nitride), the tunneling insulating layer, the semiconductor layer, and the insulating layer are sequentially stacked from the sidewall.

Further, in an example, for each channel structure, the opening in the joint insulating layer is expanded to be larger than the lower channel hole, and the opening can expose a top portion of the semiconductor layer (also referred to as lower channel layer) in the lower portion of the channel structure. Then, a joint material, such as a semiconductor layer is disposed in the opening of the joint insulating layer to form the joint structure, the joint structure is connected with the lower channel layer in the lower portion of the channel structure.

It is noted that in some embodiments, the lower channel holes are filled with sacrificial channel structures initially. The sacrificial channel structures will be replaced with real channel structures at the same time to form the upper portion of the channel structures.

FIG. 8A shows a cross-sectional view of the semiconductor device 800 after the formation of the joint structures and lower portion of the channel structures in the array regions.

As shown in FIG. 8A, a lower stack 821 of sacrificial layers and insulating layers is stacked alternatingly on a substrate 803. Then, a joint insulating layer 825 is stacked on the lower stack 821.

Then, a lower portion of the channel structures are formed in the lower stack 821 in the array regions 801. In an example, an opening for a lower channel hole is formed in the joint insulating layer 825 and the lower stack 821. Then, a lower portion 830 of a channel structure is formed in the lower channel hole. The lower portion 830 of the channel structure incudes a blocking insulating layer 831, a charge storage layer 832, a tunneling insulating layer 833, a semiconductor layer 834, and the insulating layer 835. It is noted that while in the example shown in FIG. 8A, the lower portion 830 is compatible with the SWS technology, the FIG. 8A can be modified to be compatible with other technology, such as SEG technology.

It is also noted that, in some examples, the lower portion 830 includes a sacrificial channel structure (e.g., sacrificial polysilicon structure) and the sacrificial channel structure can be replaced with real channel structure by later processes, such as the processes to form the upper portion of the channel structure.

Further, in an example, the opening in the joint insulating layer is expanded, and a top portion of the semiconductor layer 834 (also referred to as lower channel layer) is exposed. Then, a joint material, such as a semiconductor layer is disposed in the opening of the joint insulating layer to form the joint structure 840, the joint structure 840 is connected with the lower channel layer 834 in the lower portion 830 of the channel structure.

At S735, the joint insulating layer is removed from the staircase region.

In an example, lithography technique can be used to cover the array regions 801 and expose staircase regions 802, and then a suitable etch process can be used to remove the joint insulating layer from the exposed staircase regions 802.

FIG. 8B shows a cross-sectional view of the semiconductor device after the joint insulating layer 825 is removed from the staircase regions 802.

At S740, an upper stack of sacrificial layers and insulating layers are formed in the array regions and the staircase regions. In some examples, suitable planarization process is performed, and then sacrificial layers and insulating layers for the upper stack are stacked alternatingly.

FIG. 8C shows a cross-sectional view of the semiconductor device with sacrificial layers and insulating layers for an upper stack 826 being deposited. It is noted that, for ease of illustration, four pairs of sacrificial layers and insulating layers for the upper stack 826 are shown. However, the upper stack 826 can include any suitable pairs of sacrificial layers and insulating layers. It is noted, in the staircase regions 802, thickness of the sacrificial layers (in both lower stack 821 and the upper stack 826) and the thickness of the insulating layers (in both lower stack 821 and the upper stack 826) are relatively consistent. For example, in the staircase regions 802, the sacrificial layers (in both lower stack 821 and the upper stack 826) are of a same thickness within process variations, and the insulating layers (in both lower stack 821 and the upper stack 826) are of a same thickness within process variations.

At S750, the upper portion of the channel structures are formed in the array regions. In an example, photo lithography technology is used to define patterns of channel holes in photoresist and/or hard mask layers, and etch technology is used to transfer the patterns into the upper stack of sacrificial layers and insulating layers. Thus, channel holes are formed in the upper stack of sacrificial layers and insulating layers in the array regions. The channel holes expose the joint structure, such as 840.

Then, upper portion of the channel structures are formed in the channel holes. In an example, a blocking insulating layer (e.g., silicon dioxide) is formed on the sidewall of channel holes for the upper portion of the channel structures, and then the charge storage layer (e.g., silicon nitride), and the tunneling insulating layer are sequentially stacked from the sidewall.

Before stacking a semiconductor layer, the bottom of the channel holes can be etched to expose the joint structure 840. Then, the semiconductor layer is disposed, and can be connected to the joint layer. The joint layer then connects the semiconductor layer in the upper portion of the channel structures with the semiconductor layer in the lower portion of the channel structures.

At S760, stair steps are formed in the staircase regions. In some embodiments, the stair steps are formed using etch-trim process and chop process. The etch-trim process and the chop process in S760 can be the same as the etch-trim process and chop process in S260; the description has been provided above and will be omitted here for clarity purposes.

According to some aspects of the disclosure, thickness of the sacrificial layers and the thickness of the insulating layers in the staircase regions are relatively consistent, thus the chop process can be performed with reduced etch loading effect, and can achieve better stair step profile, to facilitate further contact process in some examples.

At S770, further process(es) can be performed on the semiconductor device. The further processes in S770 can be the same as the further processes in S270; the description has been provided above and will be omitted here for clarity purposes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor device fabrication, comprising:
    forming a substrate having a first region and a second region along a first direction that is parallel to a main surface of the substrate;
    forming, in the first region and the second region, a first stack of alternating gate layers and insulating layers along a second direction that is perpendicular to the main surface of the substrate;
    forming, in the first region and the second region, a third stack of alternating gate layers and insulating layers;
    removing the third stack of alternating gate layers and insulating layers from the second region to expose the first stack of alternating gate layers and insulating layers in the second region;
    depositing an insulating material on top of the third stack of alternating gate layers and insulating layers remaining in the first region and on top of the first stack of alternating gate layers and insulating layers in the second region;
    forming a joint structure in the insulating material in the second region;
    depositing a protecting layer on top of the insulating material in the first region and the second region,
    polishing to remove the protecting layer and the insulating material in the first region with a stop on the protecting layer in the second region; and
    forming a second stack of alternating gate layers and insulating layers on top of the third stack of alternating gate layers and insulating layers in the first region and on top of the insulating material in the second region.

2. The method of claim 1, wherein the insulating material includes silicon dioxide, and the protecting layer includes silicon nitride.

3. The method of claim 1, wherein the forming, in the first region and the second region, the third stack of alternating gate layers and insulating layers comprises:
    depositing a last sacrificial layer of the sacrificial layers with a larger thickness than other sacrificial layers in the third stack of alternating gate layers and insulating layers.

4. The method of claim 1, further comprising:
    forming, in the second region, a first portion of a channel structure in the first stack of alternating gate layers and insulating layers; and
    forming, in the second region, a second portion of the channel structure in the second stack of alternating gate layers and insulating layers,
    the joint structure connecting the first portion of the channel structure with the second portion of the channel structure.

5. A method for semiconductor device fabrication, comprising:
    forming a substrate having a first region and a second region along a first direction that is parallel to a main surface of the substrate;
    depositing, in the first region and the second region, a first stack of alternating sacrificial layers and insulating layers along a second direction that is perpendicular to the main surface of the substrate;
    depositing, in the first region and the second region, a joint insulating layer;
    removing the joint insulating layer from the first region; and
    depositing, in the first region and the second region, a second stack of alternating sacrificial layers and insulating layers, wherein
    a lowermost sacrificial layer in the second stack of alternating sacrificial layers and insulating layers is deposited on the top of the joint insulating structure in the second region and the first stack of alternating gate layers and insulating layers in the first region.

6. The method of claim 5, further comprising:
    forming, in the second region, a first portion of a channel structure in the first stack of alternating gate layers and insulating layers;
    forming, in the second region, a second portion of the channel structure in the second stack of alternating gate layers and insulating layers; and
    forming, in the second region, a joint structure in the joint insulating layer, the joint structure connecting the first portion of the channel structure with the second portion of the channel structure.

7. A method for semiconductor device fabrication, comprising:
    forming a substrate having a first region and a second region along a first direction that is parallel to a main surface of the substrate;
    forming, in the first region and the second region, a first stack of alternating gate layers and insulating along a second direction that is perpendicular to the main surface of the substrate;
    forming, in the first region and the second region, a third stack of alternating gate layers and insulating layers;
    removing the third stack of alternating gate layers and insulating layers from the second region to expose the first stack of alternating gate layers and insulating layers in the second region;
    depositing an insulating material on top of the third stack of alternating gate layers and insulating layers remaining in the first region and on top of the first stack of alternating gate layers and insulating layers in the second region;
    forming a joint structure in the insulating material in the second region;
    forming an etch protecting mask on top of the insulating material in the second region with the insulating material in the first region being exposed;
    etching the insulating material in the first region to expose the third stack of alternating gate layers and insulating layers remaining in the first region based on the etch protecting mask; and
    forming a second stack of alternating gate layers and insulating layers on top of the third stack of alternating gate layers and insulating layers in the first region and on top of the insulating material in the second region.

8. The method of claim 7, wherein the insulating material includes silicon dioxide, and the etch protecting mask includes silicon nitride.

9. The method of claim 7, wherein the forming, in the first region and the second region, the third stack of alternating gate layers and insulating layers comprises:
- depositing a last sacrificial layer of the sacrificial layers with a larger thickness than other sacrificial layers in the third stack of alternating gate layers and insulating layers.

10. The method of claim 7, further comprising:
- forming, in the second region, a first portion of a channel structure in the first stack of alternating gate layers and insulating layers; and
- forming, in the second region, a second portion of the channel structure in the second stack of alternating gate layers and insulating layers, the joint structure connecting the first portion of the channel structure with the second portion of the channel structure.

* * * * *